US012757571B2

(12) United States Patent
Wang

(10) Patent No.: US 12,757,571 B2
(45) Date of Patent: Oct. 6, 2026

(54) ELECTRICALLY-DRIVEN ORGANIC COLOR-CENTER-BASED SINGLE-PHOTON SOURCES AND SENSORS

(71) Applicant: University of Maryland, College Park, College Park, MD (US)

(72) Inventor: YuHuang Wang, Laurel, MD (US)

(73) Assignee: University of Maryland, College Park, College Park, MD (US)

( * ) Notice: Subject to any disclaimer, the term of this patent is extended or adjusted under 35 U.S.C. 154(b) by 788 days.

(21) Appl. No.: 16/504,249

(22) Filed: Jul. 6, 2019

(65) Prior Publication Data

US 2020/0013991 A1 Jan. 9, 2020

Related U.S. Application Data

(60) Provisional application No. 62/694,612, filed on Jul. 6, 2018.

(51) Int. Cl.
*G01K 11/00* (2006.01)
*B82Y 15/00* (2011.01)
(Continued)

(52) U.S. Cl.
CPC ............ *H10K 50/30* (2023.02); *G01K 11/00* (2013.01); *G01N 21/75* (2013.01);
(Continued)

(58) Field of Classification Search
CPC ..... B82Y 15/00; B82Y 20/00; H01L 51/0049; H01L 51/5296; G01N 21/75;
(Continued)

(56) References Cited

U.S. PATENT DOCUMENTS

| | | | |
|---|---|---|---|
| 6,864,501 | B2 | 3/2005 | Shields et al. |
| 7,125,502 | B2 | 10/2006 | Smalley et al. |

(Continued)

FOREIGN PATENT DOCUMENTS

| | | |
|---|---|---|
| EP | 1503328 | 5/2007 |

OTHER PUBLICATIONS

Avouris, P., M. Freitag, et al. (2008). "Carbon-nanotube photonics and optoelectronics." Nat. Photonics 2(6): 341-350.

(Continued)

*Primary Examiner* — Rebecca M Fritchman
(74) *Attorney, Agent, or Firm* — Leydig, Voit & Mayer, Ltd.

(57) ABSTRACT

An electrically-driven single-photon source for producing single-photon emission. The invention also provides a method for electrically generating single photons employing the principles, materials, device configurations and devices herein. The single-photon source can contain a color center introduced into a carbon nanostructured materials, such as a carbon nanotube or a graphene nanoribbon. The color center can be an organic color center. Also provide are optoelectronic chemical sensors useful for detection of selected analytes, or measurement of local pH, local redox potential or local temperature. The sensors can contain the carbon nanostructured color center host and color center as described for sources herein. Sensors can be operated using the conditions of single-photon sources as described herein.

21 Claims, 12 Drawing Sheets

(51) Int. Cl.

| | |
|---|---|
| ***G01N 21/75*** | (2006.01) |
| ***G01N 27/414*** | (2006.01) |
| ***H04B 10/70*** | (2013.01) |
| ***H10K 50/30*** | (2023.01) |
| *B82Y 20/00* | (2011.01) |
| *G01N 21/66* | (2006.01) |

(52) U.S. Cl.
CPC .......... *G01N 27/4146* (2013.01); *B82Y 15/00* (2013.01); *B82Y 20/00* (2013.01)

(58) Field of Classification Search
CPC .... G01N 27/4146; G01N 21/66; H04B 10/70; G01K 11/00
See application file for complete search history.

(56) References Cited

U.S. PATENT DOCUMENTS

| | | | |
|---|---|---|---|
| 7,141,727 | B1 | 11/2006 | Appenzeller et al. |
| 7,359,514 | B2 | 4/2008 | Trifonov et al. |
| 7,459,137 | B2 | 12/2008 | Tour et al. |
| 8,373,157 | B2 | 2/2013 | Choi et al. |
| 8,404,506 | B2 | 3/2013 | Lochmann et al. |
| 8,980,216 | B2 | 3/2015 | Wang et al. |
| 9,983,058 | B2 | 5/2018 | Wang et al. |
| 10,316,247 | B2 | 6/2019 | Maki |
| 10,414,974 | B2 | 9/2019 | Wang et al. |
| 11,208,571 | B2 | 12/2021 | Wang et al. |
| 12,098,074 | B1 | 9/2024 | Wang et al. |
| 2006/0175601 | A1* | 8/2006 | Lieber ................. H01L 29/2003 257/E29.081 |
| 2007/0280876 | A1 | 12/2007 | Tour et al. |
| 2017/0192354 | A1* | 7/2017 | Zhao ..................... G03F 7/0046 |
| 2017/0316487 | A1* | 11/2017 | Mazed ................... G06Q 30/02 |
| 2018/0265779 | A1 | 9/2018 | Wang et al. |
| 2019/0367806 | A1* | 12/2019 | Htoon ................... C01B 32/159 |

OTHER PUBLICATIONS

Brozena et al. (2019) Controlling the optical properties of carbon nanotubes with organic colour-centere defects Nat Rev. Chem. 3(6): 375-392.

Chen, J., V. Perebeinos, et al. (2005). "Bright Infrared Emission from Electrically Induced Excitons in Carbon Nanotubes." Science (Washington, DC, U. S.) 310(5751): 1171-1174.

Gordon, L., J. R. Weber, et al. (2013). "Quantum computing with defects." MRS Bull. 38(10): 802-807.

He, X., N. F. Hartmann, et al. (2017). "Tunable Room-Temperature Single-Photon Emission at Telecom Wavelengths from sp3 Defects in Carbon Nanotubes." Nat. Photonics 11: 577. NEED.

Khasminskaya, S. et al. (2016) "Fully integrated quantum photonic circuit with an electrically driven light source." Nat. Photon. 10, 727-732. NEED.

Kwon, H.J., M. Kim et al. (2019) "Probing Trions at Chemically Tailored Trapping Defects," ACS Cen. Sci. 5 (11): 1786-1794.

Lounis, B. and M. Orrit (2005). "Single-photon sources." Rep. Prog. Phys. 68(5): 1129-1179. NEED.

Mueller, T., M. Kinoshita, et al. (2010). "Efficient narrow-band light emission from a single carbon nanotube p-n diode." Nat. Nanotechnol. 5(1): 27-31.

Pyatkov, F et al. (2016) "Cavity Enhanced light emission from electrically driven carbon nanotubes," Nature Photonics, 10, 420-427.

Xu, B., X. Wu, M. Kim, P. Wang and Y. Wang (2021) "Electroluminescence from 4-nitroaryl organic color centers in semiconducting single-wall carbon nanotubes." J. Appl. Physics 129, 044305.

Zorn, N. F., F. J. Berger, and J Zaumseil (May 2021) "Charge Transport in and Electroluminescence from sp3-Functionalized Carbon Nanotube Networks," ACS Nano, 15, 6, 10451-10463.

O'Connell, M. J. et al. (2002) "Band Gap Fluorescence from Individual Single-Walled Carbon Nanotubes," Science, 297 (5581): 593-596.

Assresahegn et al. (2015) "Advances on the use of diazonium chemistry for functionalization of materials used in energy storage systems," Carbon 92, 362-381.

Bahr et al. (2001) "Highly Functionalized Carbon Nanotubes Using in Situ Generated Diazonium Compounds," Chem. Mater. 13:3823-3824.

Biju (2014) "Chemical Modifications and Bioconjugate Reactions of Nanomaterials for Sensing, Imaging, Drug Delivery and Therapy," Chem. Soc. Rev., 43, 744-764.

Davis et al. (2009) "True Solutions of Single-Walled Carbon Nanotubes for Assembly into Macroscopic Materials," Nat. Nanotechnol. 4, 830-834.

Dyke et al. (2004) "Covalent Functionalization of Single-Walled Carbon Nanotubes for Materials Applications," J. Phys. Chem. A, 51, 11151-11159.

Gifford et al. (2018) "Exciton Localization and Optical Emission in Aryl-Functionalized Carbon Nanotubes," J. Phys. Chem. C. 122, 1828-1838; published Oct. 2017.

Gifford et al. (Aug. 2020) "Controlling Defect-State Photophysics in Covalently Functionalized Single-Walled Carbon Nanotubes," Accounts of Chemical Research 53, 1791-1801.

Gifford et al. (Nov. 2019) "Mod(n-m,3) Dependence of Defect-State Emission Bands in Aryl-Functionalized Carbon Nanotubes," Nano Letters 19, 8503-8509.

Hartmann et al. (2015) "Photoluminescence Imaging of Solitary Dopant Sites in Covalently Doped Single-wall Carbon Nanotubes," Nanoscale 7, 20521-20530.

He et al. (2017) "Low-Temperature Single Carbon Nanotube Spectroscopy of sp3 Quantum Defects," ACS Nano 11, 10785-10796.

He et al. (Aug. 2018) "Carbon nanotubes as emerging quantum-light sources," Nature Materials 17, 663-670.

Hudson et al. (2004) "Water-soluble, Exfoliated, Nonroping Single-Wall Carbon Nanotubes," J. Am. Chem. Soc. 126, 11158-11159.

Hudson et al. (2006) "Triazenes as a Stable Diazonium Source for Use in Functionalizing Carbon Nanotubes in Aqueous Solutions," Chem. Materials, 18"2766-2770.

Kim et al. (Sep. 2018) "Mapping Structure-Property Relationships of Organic Color Centers," Chem 4, 2180-2191.

Kwon et al. (2015) "Optical Probing of Local pH and Temperature in Complex Fluids with Covalently Functionalized, Semiconducting Carbon Nanotubes," J. Phys. Chem. C 119, 3733-3739.

Kwon et al. (2016) "Molecularly Tunable Fluorescent Quantum Defects," J. Am. Chem. Soc. 138, 6878-6885.

Luo et al. (Jul. 2019) "One-pot, Large-scale Synthesis of Organic Color Center-Tailored Semiconducting Carbon Nanotubes," ACS Nano, 13, 8417-8424; and its Supporting Information. https://doi.org/10.1021/acsnano.9b04087.

Maeda et al. (2016) "Tuning of the Photoluminescence and Up-Conversion Photoluminescence Properties of Single-Walled Carbon Nanotubes by Chemical Functionalization," Nanoscale 8, 16916-16921.

Paulus et al. (2013) "Covalent Electron Transfer Chemistry of Graphene with Diazonium Salts," Accounts of Chemical Research 46, 160-170.

Piao et al. (2013) "Brightening of Carbon Nanotube Photoluminescence through the Incorporation of $sp^3$ Defects," Nat. Chem. 5, 840-845.

Saha et al. (Sep. 2018) "Narrow-band Single-Photon Emission through Selective Aryl Functionalization of Zigzag Carbon Nanotubes," Nat. Chem. 10, 1089-1095.

Schmidt et al. (2009) "Mechanism of the Coupling of Diazonium to Single-Walled Carbon Nanotubes and Its Consequences," Chemistry—A European Journal 15, 2101-2110.

Shiraki et al. (2016) "Near Infrared Photoluminescence Modulation of Single-Walled Carbon Nanotubes Based on a Molecular Recognition Approach," Chem. Commun. 52, 12972-12975.

Shiraki et al. (2017) "Near Infrared Photoluminescence Modulation by Defect Site Design Using Aryl Isomers in Locally Functionalized Single-Walled Carbon Nanotubes," Chem. Commun. 53, 12544-12547.

(56) References Cited

OTHER PUBLICATIONS

Shiraki et al. (Dec. 2018) "Multistep Wavelength Switching of Near-Infrared Photoluminescence Driven by Chemical Reactions at Local Doped Sites of Single-Walled Carbon Nanotubes," Chem. Eur. J. 24, 19162-19165.
Wang et al. (2017) "Superacid-Surfactant Exchange: Enabling Non-destructive Dispersion of Full-Length Carbon Nanotubes in Water," ACS Nano 11, 9231-9238.
Wang et al. (Jul. 2022) "Quantum Defects: What Pairs with the Aryl Group When Bonding to the sp2 Carbon Lattice of Single-Wall Carbon Nanotubes?" J. Am. Chem. Soc. 144, 29, 13234-13241. https://doi.org/10.1021/jacs.2c03846.
Wang P. (2019) "Solution Processing of Long Carbon Nanotubes: From Fundamental to Applications," Dissertation, Doctor of Philosophy, University of Maryland, College Park.
Wu et al. (2018) "Photochemical Creation of Fluorescent Quantum Defects in Semiconducting Carbon Nanotube Hosts," Angew. Chem. Int. Ed. Engl. 57, 648-653, published on line Dec. 2017.

* cited by examiner

| OCC emission wavelength |  $-4\text{-}C_6H_4NO_2$ |  $-C_6F_{13}$ |  $-C_6H_{13}$ |  $-3{,}5\text{-}C_6H_3(NO_2)_2$ |  $-4\text{-}C_6H_4N(C_2H_5)_2$ |  $>CF_2$ |
|---|---|---|---|---|---|---|
| (5,4) | 1052 nm | 1027 nm | - | 1000 nm | - | 1025 nm |
| (6,4) | 1066 nm | 1082 nm | 1049 nm | 1029 nm | 1053 nm | 1097 nm |
| (7,3) | 1160 nm | 1190 nm | 1150 nm | 1177 nm | - | 1211 nm |
| (9,1) | 1115 nm | 1128 nm | 1086 nm | 1169 nm | - | - |
| (6,5) | 1145 nm | 1152 nm | 1105 nm | 1160 nm | 1132 nm | 1168 nm |
| (8,3) | 1159 nm | 1169 nm | 1124 nm | 1171 nm | 1127 nm | - |
| (7,5) | 1189 nm | 1206 nm | 1174 nm | 1192 nm | 1164 nm | |
| (11,0) | - | - | - | 1225 nm | - | - |
| (7,6) | 1281 nm | 1291 nm | 1226 nm | 1281 nm | 1227 nm | - |
| (9,4) | - | 1270 nm | - | - | - | - |
| (11,1) | 1486 nm | 1487 nm | - | - | - | - |
| (10,3) | 1455 nm | 1445 nm | - | - | - | - |

L-Cysteine

SCHEME 1

SCHEME 2

ELECTRICALLY-DRIVEN ORGANIC COLOR-CENTER-BASED SINGLE-PHOTON SOURCES AND SENSORS

CROSS-REFERENCE TO RELATED APPLICATIONS

This application claims the benefit of U.S. provisional application 62/694,612, filed Jul. 6, 2018 which is incorporated by reference herein in its entirety.

BACKGROUND OF THE INVENTION

The invention is related to electrically-driven single-photon sources that incorporate organic color-centers, and that can be directly interfaced with electronics to form integrated circuits. The color-centers are generated in carbon nanotube-semiconductor hosts that are, for example, connected to electrodes. Electrons and holes are separately injected into the carbon nanotube host and recombine at the color-center to produce single-photons. The invention further relates to similar single-photon sources in which trions are created from which single photons are then produced. The invention also relates to optoelectronic chemical sensors in which carbon-nanotube hosts incorporating such organic color centers function as chemically specific probes.

Single-photon sources are a foundational element for photonic-based quantum information science and technology. Single-photons are photons that are produced one at a time. They are ideal quantum bits (qubits) because of their long coherence time, ability to propagate over long distances in fibers and waveguides, and high precision manipulation using linear optical devices. (Lounis and Orrit 2005; Gisin and Thew 2007; O'Brien 2007; O'Brien, Furusawa et al. 2009.) With this photonic quantum technology, information may be gathered, transformed, and transmitted as entangled photons and electron spin on integrated circuits and devices at the Heisenberg limit—the greatest possible level of sensitivity and precision. (Lounis and Orrit 2005; Aharonovich, Englund et al. 2016.)

However, preparing single-photons with high efficiency is extremely difficult. (Lounis and Orrit 2005; Gisin and Thew 2007; O'Brien 2007; O'Brien, Furusawa et al. 2009.) The most common way to produce single-photon sources is to use nonlinear parametric down-conversion. (see: Lamas-Linares et al. 2001) However, these types of sources produce single-photons randomly and hence are not easily scalable. Additionally, more advanced applications, such as linear optical quantum computing (Knill, Laflamme et al. 2001) and quantum sensing (Boto, Kok et al. 2000) require many individually prepared photons. Scalability also necessitates that these sources are capable of being integrated into integrated circuits to allow combination of sources, detectors, and other complex reconfigurable optical structures.

Although several different color-center systems with fascinating properties are known, their integration into quantum circuits is inherently challenging. (Gordon, Weber et al. 2013; Aharonovich, Englund et al. 2016; Maldonado-Trapp, Solano et al. 2016; and Beson O. et al. 2000.) (See also, patent documents EP1503328B1, U.S. Pat. Nos. 6,864,501B2, 8,404,506B2, 7,359,514B2.) For instance, nitrogen-vacancy (NV) centers in diamond have been intensively studied because of their high stability and spin-coupled properties. However, the 3D nature of diamond makes it difficult to achieve the exact placement of color-centers, and its high refractive index makes light collection inefficient. (Aharonovich and Neu 2014.) Wide-bandgap semiconductors (e.g., SiC, ZnO) and atomically thin, 2D van der Waals materials (e.g., h-BN, WSe2) can address some of these challenges, but their quantum properties are far from ideal. (Srivastava, Sidler et al. 2015; Tran, Bray et al. 2016.) Most problematically, virtually all color-centers in these materials occur as native defects, with their atomic structure and chemical nature typically unknown.

In stark contrast to native defects, organic color-centers are chemically engineered systems with highly predictable, high quality quantum characteristics. (Aharonovich, Englund et al. 2016.) Chemically, organic color-centers can be synthetically created, for example, by incorporating $sp^3$ defects in the $sp^2$ carbon lattice of single-walled carbon nanotube (SW-CNT) semiconductors. Each organic color-center produces a finite potential well within the extended $sp^2$ carbon lattice of the carbon nanotube. Unlike native defects, which normally act as quenching traps for nanotube excitons, organic color-centers are optically allowed, producing photoluminescence in the short-wave infrared that is unexpectedly bright, (Piao, Meany et al. 2013) molecularly tunable, (Piao, Meany et al. 2013; Kwon, Furmanchuk et al. 2016) and single-photon in nature. (He, Hartmann et al. 2017) By optically exciting the nanotube host, several organic color-centers have been shown to produce single-photons featuring a purity of >99% at 295 K, ultra-sharp emission, and high spectral stability. (He, Hartmann et al. 2017; Srinivasan and Zheng 2017) However, the source is produced by optically exciting the nanotube host, which makes scaling a major challenge since it requires another high quality light source to power it.

It has been demonstrated that electrons and holes can be electrically injected separately into a nanotube and recombine radiatively to produce a light-emitting diode. (Chen, Perebeinos et al. 2005; Mueller, Kinoshita et al. 2010.) The nanotube used in these cases does not contain an incorporated color-center. In addition, the light produced in this way is not single-photon in nature.

In an aspect, the invention relates to optoelectronic chemical sensors in which carbon-nanotube hosts incorporating such organic color centers function as chemically specific probes. Although SWCNTs can be employed in extremely sensitive optical and electronic sensors, the chemical selectivity is generally poor (Huang et al. 2013; Hong et al. 2015; Kwon et al. 2015) which makes it difficult to differentiate specific chemicals in certain applications, such as $H^+$ in the complex chemical environment of biological systems. The issue of selectivity of such sensors can be addressed as discussed herein using carbon nanotubes incorporating sp3 quantum defects that can be chemically tailored with recognition moieties to significantly improve both sensitivity and chemical specificity.

SUMMARY OF THE INVENTION

In one aspect, the invention provides an electrically-driven single-photon source for producing single-photon emission. The single-photon generated is characterized by a photon energy. The single-photon can also exhibit a certain emission intensity that can be measured, if desired. The invention also provides a method for electrically generating single photons employing the principles, materials, device configurations and devices herein. As described herein electrical generation of single photons is distinct from optical generation of single photons.

The single-photon source comprises a nanoscale color center host that includes a color center and electrodes configured to allow controlled, numbers of low-energy electrons and holes to be separately injected into the color center to produce single-photon emission. In embodiments, the numbers of holes or electrons range from 0 to $10^{10}$/color center/second. In an embodiment the low energy electrons and holes have energy ranging from 0.5 to 1.5 eV. In an embodiment, the nanoscale color center host is a carbon nanotube or a graphene ribbon. In an embodiment, the nanoscale color center host is a semiconducting carbon nanotube. In an embodiment, a color center host contains only one color center. In an embodiment, a color center host contains only one organic color center. In an embodiment, a color center host contains two color centers which are the same, i.e., formed by the same chemistry and emitting photons with identical photon energy.

In an embodiment, the single photon emission has a wavelength ranging from 880 nm to 2500 nm. In an embodiment, the single photon emission has a wavelength ranging from 1000 to 2000 nm.

In an embodiment, the electrodes include a source and drain electrode in electrical contact with the color center host, which electrodes are configured to separately inject electrons or holes into the semiconducting color center host and the color center. In a further embodiment, the electrodes include the source and drain electrodes and at least two gate electrodes, not electrically connected to the color center host, which are configured with respect to the color center host and the color center therein for application of a controlled positive or negative potential to control the injection of a selected relative number of electrons or holes into the color center. The holes and electrons are separately injected into the color center.

In an embodiment, the nanoscale color center host is a carbon nanostructure which comprises a $sp^2$ lattice of carbon atoms. In an embodiment, the carbon nanostructure is a carbon nanotube or a graphene nanoribbon. In an embodiment, the color center represents a defect in the $sp^2$ carbon atom lattice of the color center host that is chemically introduced by covalently bonding into the carbon nanotube or graphene ribbon through formation of C—C bonds. In an embodiment, the color center is a $sp^3$ defect in the $sp^2$ carbon atom lattice. In an embodiment, the color center is introduced by substitution of one or more carbon atom in the $sp^2$ carbon atom lattice with boron or nitrogen atoms.

In an embodiment, the color center is organic in nature comprising one or two organic functional groups that are covalently bonded to the $sp^2$ carbon atom lattice. In an embodiment, the organic color center is formed by covalent bonding to a carbon nanotube or graphene nanoribbon. In an embodiment, the organic color center is formed by the formation of C—C bonds. In an embodiment, the color center is formed by covalent bonding of one or two monovalent functional groups to the carbon lattice. In an embodiment, the color center is formed by covalent bonding of a divalent functional group to the carbon lattice. In an embodiment, the color center is formed by covalent bonding of a divalent organic moiety to the $sp^2$ carbon lattice of the color center host. In embodiments, the divalent organic moiety that forms the color center is selected from $>C(R)_2$, $>C_6(R)_4$, where R is H, an optionally substituted alkyl group or an optionally substituted aryl group or a fluorinated derivative of such groups, where optional substitution, includes substitution with an amino (—$NH_2$) or a carboxylic acid group (—COOH). In embodiments, the divalent organic moiety that forms the color center is selected from $>CH_2$, $>C_6H_4$, or a fluorinated derivative of such groups. In an embodiment, the divalent organic moiety is selected from $>CH_2$, $>CF_2$, $>C_6H_4$, $>C_6F_4$, or $>C_6H_2F_2$.

In embodiments, the color center host is a carbon nanostructure. In embodiments, the color center host is a carbon nanotube selected from a single-walled carbon nanotube, a double-walled carbon nanotube, or a single-walled carbon nanotube semiconductor with a surface boron nitride coating. In embodiments, the color center host is a semiconducting carbon nanotube selected from a single-walled carbon nanotube, a double-walled carbon nanotube, or a single-walled carbon nanotube semiconductor with a surface boron nitride coating. In an embodiment, the color center host is a single-walled carbon nanotube selected from those of structures: (10,0), (11,0), (13,0), (14,0), (16,0), (17,0), (11,1), (12,1), (14,1), (15,1), (8,7), (9,7), and (9,8). In a more specific embodiment, the color center host is a single-walled carbon nanotube selected from those of structures: (10,0), (11,0), (13,0), (14,0), (16,0), (17,0), (11,1), (12,1), (14,1), (15,1), (8,7), (9,7), and (9,8) and the color center is formed by covalent bonding of a divalent organic moiety selected from $>CH_2$, $>CF_2$, $>C_6H_4$, $>C_6F_4$, or $>C_6H_2F_2$ to the carbon nanotube.

In an embodiment, the carbon nanostructure is a graphene nanoribbon. In an embodiment, the carbon nanostructure is a semiconducting graphene nanoribbon. In an embodiment, the color center host is a semiconducting graphene nanoribbon and the color center is formed by covalent bonding of a divalent organic moiety selected from $>CH_2$, $>CF_2$, $>C_6H_4$, $>C_6F_4$, or $>C_6H_2F_2$ to the semiconducting graphene nanoribbon.

The source and drain electrodes of the single-photon source can be any configuration for such electrodes known in the art and wherein the nanoscale color center host is electrically connected to such source and drain electrodes by any configuration or method known in the art. For example, the source and drain electrodes can be formed by methods known in the art for forming semiconductor devices. In an embodiment, a trench is formed between the source and drain electrodes and the nanoscale color center host is suspended across the trench in electrical contact with the source and drain electrodes. The color center is positioned between the source and drain electrodes such that electrons or holes can be injected into the color center host and the color center. The color center host can be positioned with respect to the source and drain electrodes by, for example, being grown in place using chemical vapor deposition, or being deposited in place by any other method known in the art for placement of nanoscale species, such as carbon nanostructures, particularly carbon nanotubes or graphene nanoribbons.

In an embodiment, the photon source has at least two gate electrodes in a split gate configuration. The gate electrodes are positioned with respect to the color center host and the color center to produce a p-electrostatically doped region on one side of the color center in the color center host and an n-doped on the other side of the color center in the semiconducting color center host. In a more specific embodiment of the split gate configuration, a third gate electrode is provided that is insulated from and directly applied on the color center. The third gate can be used to tune the energy level of the color center with respect to the source and drain electrodes. In an embodiment, the gate electrode configuration is a top-gate configuration. In an embodiment, the gate electrode configuration is a bottom-gate configuration.

In an embodiment, the voltage applied through the source and drain electrodes across the color center is −0.1 to +0.50 eV with respect to the photon energy of the single photons that would emit by electron/hole recombination at the color center. The photon energy of a single photon depends at least in part on the chemical nature of the color center. The photon energy (wavelength) of a given color center in a given color center host can be determined by art-known methods. In an embodiment, the voltage applied through the source and drain electrodes across the color center is between 0 and 0.50 eV with respect to the photon energy of the single photons that would emit by electron/hole recombination at the color center. In a related embodiment, the voltage applied through the source and drain electrodes across the color center ranges from −0.050 to +0.25 eV with respect to the photon energy of the single photons that emit by electron/hole recombination at the color center. In another embodiment, the voltage applied through the source and drain electrodes across the color center ranges from −0.01 to +0.05 eV with respect to the photon energy of the single photons that emit by electron/hole recombination at the color center. In an embodiment, the voltage applied through the source and drain electrodes across the color center is equal to or at most 30 meV less than the photon energy of the single photons that would emit by electron/hole recombination at the color center. In an embodiment, the voltage applied through the source and drain electrodes across the color center is equal to or at most 10 meV less than the photon energy of the single photons that would emit by electron/hole recombination at the color center.

In an embodiment, the current of electrons or holes applied across each color center through the source and drain electrodes is less than 1 nano ampere ($1\times10^{9}$ amp) per color center. In an embodiment, the current of electrons or holes applied across each color center is between $1\times10^{-17}$ amp and $1\times10^{-9}$ amp. In an embodiment, the current applied across each color center is in the range of $1\times10^{-16}$ to $1\times10^{-10}$ ampere per color center. In an embodiment, the current applied across each color center is between $1\times10^{-11}$ amp and $1\times10^{-10}$ amp. In an embodiment, the current applied across each color center is $1\times10^{-1}$ ampere (0.01 namp)+/−10% per color center.

In an embodiment, the relative ratio of electrons to holes injected is 1+/−0.05% and single photon generation involves radiative recombination of an electron and a hole. In an embodiment, the relative ratio of electrons to holes ranges from 0.5 to 1.5. The relative ratio of electrons to holes is adjusted by the gate electrons as is known in the art.

In an embodiment, the relative number of electrons to holes injected is greater than or equal to 1.1 or less than or equal to 0.9 resulting in the production of trapped trions and generation of single-photons from the localized trions.

In an embodiment, the photon source is cooled from 0 K to 230 K. In an embodiment, the photon source is cooled from 77 K to 230 K. In an embodiment, the photon source is cooled to a temperature from 180 K to 230 K. In an embodiment, the photon source is temperature controlled to a selected temperature (in degrees K) within a range of +/−5 degrees K. In an embodiment, the photon source is temperature controlled to a selected temperature (in degrees K) within a range of +/−1 degrees K.

In an embodiment, the photon source is provided with an inert coating which may coat only a portion of the source to protect the components therein. The protective coating is provided such that the single photon can be emitted from the source. The protective coating can, for example, be a polymer or resin coating or an oxide or nitride coating. In an embodiment, the protective coating reduces or prevents charge noise and environmental fluctuations. In an embodiment, the protective coating provided electrical insulation. In an embodiment, the protective coating is selected from polystyrene, $HfO_2$, $Al_2O_3$, boron nitride or a combination thereof.

The invention relates to methods for generating single photons by electrical injection of electrons and holes into a color center hosts and the color center therein. In embodiments, the methods involve use of single photon devices as described herein. In an embodiment, the method involves:

(a) providing a color center host which is a semiconducting carbon nanotube or graphene nanoribbon that includes a color center chemically introduced by covalently bonding into the carbon nanotube or graphene ribbon through formation of C—C bonds, or introduced by substitution of one or more carbon atom in the carbon nanotube or graphene nanoribbon with one or more boron or nitrogen atoms; and (b) separately introducing electrons and holes into the color center host and the color center to generate single photons.

In another aspect, the invention provides an optoelectronic chemical sensor comprising a color center in a color sensor host, particularly a nanoscale color senor host and more particularly a carbon nanotube or a graphene nanoribbon host. The color center of the sensor can be the same as the color center described for the photon source. The color center host of the sensor can be the same as the color center described for the photon source. The color center of the sensor, however, interacts with an external chemical species which affects the emission from the color center or the color center is affected by a change in the environment of the color center, the change may be chemical or physical. The emission of the color center can be chemically affected by a selected analyte, such that detection of a change in emission of the color center indicates the presence of the analyte at the color center. The analyte may react with, bond to or complex with a chemical moiety in the color center. Emission from the color center may be affected, for example, by a change in local pH and/or a change in local temperature. Measurement of the change in emission provides a measurement of pH or temperature. The influence on the color center can result in any measureable change in emission. The change in emission may be a change in wavelength and/or a change in emission intensity. The change in emission may be a change peak shape, e.g., full width at half maximum intensity, or a change in emission lifetime.

In an embodiment, the color center is chemically introduced in to the color center host by covalent bonding into the host, particularly a carbon nanotube or graphene nanoribbon, through formation of one or more C—C bonds, wherein the light emission of the color center changes in energy, intensity or both when the color center (1) interacts with a specific chemical species (analyte) and/or (2) responds to temperature change in the local environment.

In an embodiment, the sensor comprises an electron configuration as described for the photon source to provide for controlled injection of electrons and holes into the nanoscale color center host and the color center and a detector for detection of light emission from the color center. Any suitable detector appropriate for use in detecting a change in emission wavelength or emission intensity can be employed. In embodiments, detectors can be provided with additional optical components, e.g., a long-pass filter, appropriate for use in detecting the change in emission wavelength or emission intensity or other change in emission. Suitable detectors include among others, photodetectors, photodiodes, silicon detectors, CCD cameras, InGaAS detectors or detector arrays.

In an embodiment, the sensor electrode configuration, comprises a source electrode and a drain electrode and at least two gate electrodes configured with respect to the color center host to allow separate injection of electrons and holes into the color center to electrons.

In an embodiment, the sensor is implemented in a device configuration as described for the single-photon source. Alternatively, the sensor device configuration need not produce single photons. In an embodiment, a sensor comprises one or more color center hosts, e.g., carbon nanotubes or graphene nanoribbons. In an embodiment, a sensor comprises a plurality of color center hosts. In an embodiment, each color center host of such plurality can comprise the same color center which are sensitive to the same analyte or physical change. In an embodiment, among the plurality of color center hosts in the center there can be a portion of the color center hosts that have different color centers that are sensitive to different analytes or different physical changes. In an embodiment, the plurality of color center hosts can be formed into a thin film. In an embodiment, the thin film ranges in thickness from submonolayer to 10 nm. In an embodiment, the thin film ranges in thickness from submonolayer to 1 nm. In an embodiment, the color centers of the plurality of color center hosts are patterned with defined locations in the film, where different locations can be associated with color center hosts having the same or different color centers. For example, a film may be patterned with a plurality of color center hosts, wherein a first portion of the plurality of color center hosts with a first color center is positioned at first defined locations and wherein a second portion of the plurality of color center hosts with a second color center is positioned at second defined locations. Such patterning can be extended to a selected number (n) of different color centers at different defined locations. The selected number (n) for such patterning can, for example, be 2-100, 2-50, 2-25, 2-10 or subranges thereof.

In a specific embodiment, the color center host is a carbon nanotube having the (6,4) carbon nanotube structure. In an embodiment, the color center host is a carbon nanotube having the (6,4) carbon nanotube structure and the detector is a silicone detector.

In an embodiment, the color center comprises a chemical moiety that complexes with one or more selected analytes, or reacts with one or more selected analytes. In an embodiment, the color center contains a reactive group, such as an —$NH_2$, a —COOH or a —SH (thiol) group which can be reacted to bond a complexing moiety or to bond to another functional group which exhibits different reactivity. Chemical moieties that can be incorporated into color centers that selectively complex with analytes of potential interest include amines (which can be affected by pH), chelating agents, such as 2,2',2'',2'''-(Ethane-1,2-diyldinitrilo)tetraacetic acid (EDTA), complexing moieties such as crown ethers and related cyclic organics, and various biological molecules, such as oligopeptides, peptides, proteins and fragments thereof or oligonucleotides, including single-stranded or double stranded oligonucleotides and more specifically including oligonucleotides of selected sequence for use as probes for oligonucleotides of complimentary sequence.

The invention further relates to sensing methods employing the sensors of this invention. More specifically, the invention provides methods for detection of a selected analyte, methods for detection of a selection cation, methods for detection of pH, methods for detection of a redox reaction, method for detection of redox potential or methods for detection of a change in temperature.

In an embodiment, the invention provides a method of detecting a specific chemical species (analyte) which comprises:

(a) providing an optoelectronic chemical sensor as described herein comprising a color center as described herein which is sensitive to the presence of the analyte; and (b) detecting a change in emission from the sensor associated with an interaction with the analyte.

In an embodiment, the invention provides a method for detecting a change in temperature in the local environment of a sensor which comprises:

(a) providing an optoelectronic chemical sensor as described herein comprising a color center as described herein which is sensitive to a change in local temperature; and (b) detecting a change in emission from the sensor associated with the change in temperature.

Analogous methods are provided herein for assessing pH or redox potential and particularly for detection of pH or redox potential in a living cell.

Additional, aspects and embodiments of the invention will become apparent on review of the detailed description and drawings.

BRIEF DESCRIPTION OF THE DRAWINGS

FIG. 4A is a broadband fluorescence image of the aminoaryl-tailored (7,5) SWCNT. FIG. 4B illustrates optical excitation of emission from the color center ($E_{11}^{-}$) by irradiation of the nanotube at 730 nm. Irradiation also excites the normal $E_{11}$ emission from the nanotube. FIG. 4C illustrates spatially resolved emission along the length of the nanotube from the color center ($E_{11}^{-}$) along with the $E_{11}$ photoluminescence (PL) from the nanotube. Each pixel is 121 nm wide. FIG. 4D is a spatially and spectrally resolved fluorescence image of the carbon nanotube carrying the organic color center. Localized emission is observed as "hot spots' along the nanotube host, with the full spectrum simultaneously resolved for each pixel.

FIG. 5A is a scanning electron microscopy (SEM) image showing SWNTs positioned across source and drain electrodes. FIG. 5B is a luminescence image from a region of the device of FIG. 5A under optical excitation. FIG. 5C is a luminescence image from a region of the device of FIG. 5A under impact excitation. Impact excitation is generated by applying a source-drain voltage across the nanotube host. Note the concentration of emission from the color center in FIG. 5C. The "S" and "D" notations on the figures indicate the boundaries of the source and drain electrodes.

DETAILED DESCRIPTION

The invention is related to electrically-driven single-photon sources that incorporate organic color-centers, and that can be directly interfaced with electronics to form integrated circuits. The invention also relates to optoelectronic chemical sensors in which color center hosts incorporating such color centers function as chemically specific probes. In an embodiment, the optoelectronic chemical sensors employ the electrically-driven single-photon sources of the invention.

The invention relates to the electrical generation of single photons by separate injection of electrons and holes into a nanoscale color center host that is tailored with a color center. In an embodiment, the nanoscale color center host is a carbon nanotube or a graphene ribbon. In an embodiment, the nanoscale host is a semiconducting carbon nanotube. In an embodiment, the color center is organic in nature and is formed by covalent bonding of one or two organic functional groups to the nanoscale color center host. In an embodiment, the color center is formed by replacing one or more carbons in the nanoscale color center host with a nitrogen or boron atoms.

Figure 1:
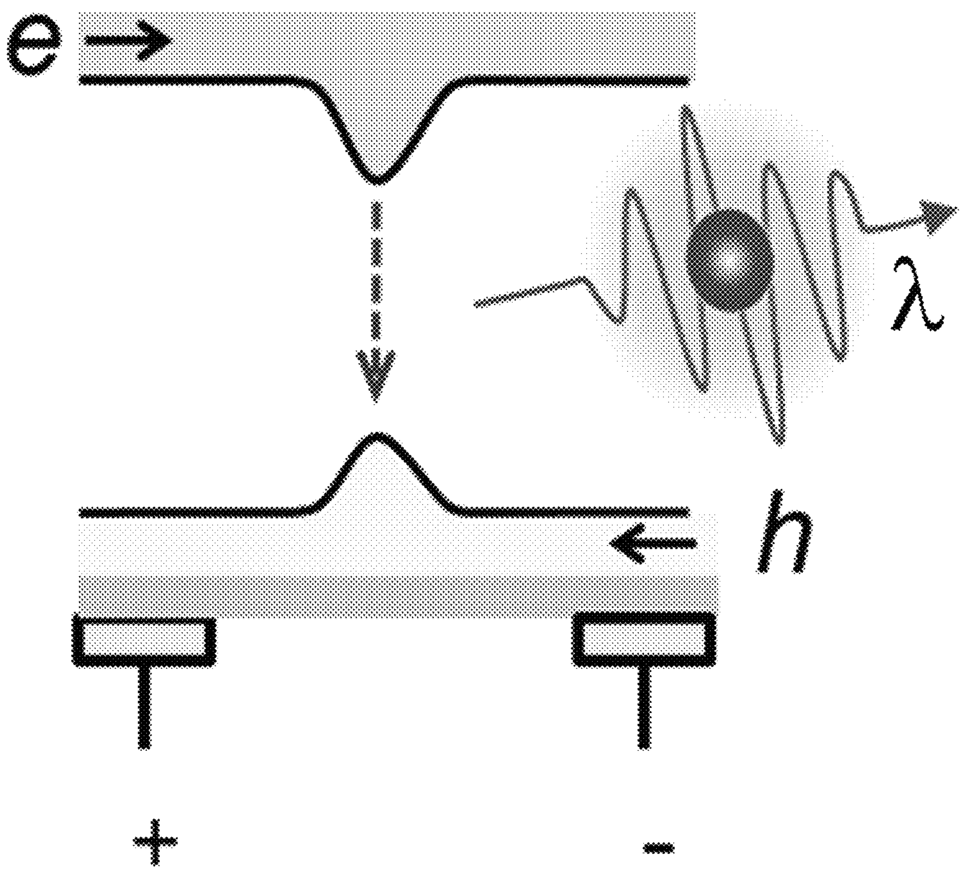
FIG. 1 is a schematic illustration of electrically-driven single-photon generation from a color center system, particularly an organic color center, in a semiconducting color center host, where the host in particular is a semiconducting nanotube. The figure shows the electronic band structure of the color center created in the semiconducting color center host. Electrons (e) and holes (h) are shown as separately injected into the color center from different direction along a dimension of the semiconducting color center host. An electron and hole recombine at the color center to give bursts of single photons of a wavelength associated with the chemical/electronic nature of the color center and the semiconducting host. Preferably, electrons and holes are injected in about equal numbers to recombine to generate the single photon. Alternatively and/or in addition, an excess of electrons or an excess of holes can be injected to form negative or positive trions, respectively, from which single photons are emitted at a wavelength different (longer) from those of electron/hole recombination.

The electrons and holes are injected electrically rather than relying on optically-generated excitons, to drive the generation of single-photons. FIG. 1 illustrates the mechanism believed to underpin the generation of single-photon in the devices herein. FIG. 1 illustrates the electronic band structure of an organic color-center system such as is formed in a nanotube. Electrons (e) and holes (h) are separately injected into the color-center from different directions along the one-dimensional semiconductor (e.g., the carbon nanotube) and recombine at the color-centers to give bursts of single-photons at a given wavelength (λ). FIG. 1 illustrates gating + and − gating electrodes through which a selected potential is applied to facilitate injection of electrons and holes. The wavelength of the single-photon is determined by the chemical nature of the organic color center and the type of carbon nanotube host.

Compared with optical excitation of the host, which generates excitons, or electron-hole pairs that are strongly bounded by Coulomb interactions, the electrical pumping as illustrated in FIG. 1 enables small device footprint making incorporation into integrated circuits straightforward. Additionally, a wide array of demonstrated semiconductor techniques are known and available in the art to construct nano-scale devices and incorporate nanotubes or related carbon nanostructures into such devices. (Avouris, Freitag et al. 2008; Mueller, Kinoshita et al. 2010; Cao and Han 2013; Tulevski, Franklin et al. 2014.) Using such methods and device configurations and as illustrated below, electron and holes can be channeled to the color-center of carbon nanotubes, where they will recombine to produce pure single-photons.

The semiconductor hosts used can in one embodiment be one of the diverse nanotube structures, known as (n,m) chiralities, which are now available in high purity. (Tu, Manohar et al. 2009.) Organic color-centers are incorporated into the semiconductor channel by any known means for covalent bonding to the carbon nanotube. More specifically, color centers can be formed by any chemical method that allows bonding a selected functional group to the nanotube sidewall. Yet more specifically covalent bonding can be achieved based on propagative Billups-Birch reaction (Deng, Zhang et al. 2011; Zhang, Valley et al. 2013), reactions with diazonium salts (Piao, Meany et al. 2013; Powell, Piao et al. 2016), light-activated reactions with diazoether (Powell, Kim et al. 2017) and chemical or photochemical reactions with alkyl and aryl halides (Kwon, Furmanchuk et al. 2016; Wu, Kim et al. 2018). The location of incorporation of the organic color-centers into the nanotube hosts may be further controlled with selective focusing of light or controlled lithographically.

By separately injecting electrons and holes electrically into organic color-centers to produce single-photons, the invention opens a new pathway that allows direct integration of semiconductor technologies with quantum information. To improve purity of injected electrons and holes, the nanotube host can be gated, using either top gates or bottom gates, to form p- and n-type regions by electrostatic doping. This gating technique was demonstrated by to produce p-n junction diodes (Lee, Gipp et al. 2004) and later by to facilitate the generation of electroluminescence (Mueller, Kinoshita et al. 2010). Particularly, it has been shown that light emission is observable at a source-drain current as low as ~10 nA and the source-drain voltage drops across the nanotube channel on the order of the bandgap (~1 eV). (Mueller, Kinoshita et al. 2010) However, in both cases, the luminescence is generated in nanotubes, without the organic color-centers as employed in the present invention. In the presence of a deep trap, which is tunable from 92-400 meV due to the organic color-centers, electrons and holes recombine preferentially at the color-centers because of their lower energy levels. Further improvement in the brightness of emission can be achieved by incorporating cavity design to improve the light collection efficiency and additionally impart directionality for the emitted light. Directionality for emitted light can be achieved by coupling the semiconducting color center host, for example an organic color-center-tailored SWCNT, to a photonic cavity or waveguide. (Bose, Cai et al. 2012; Kim, Richardson et al. 2016). In a specific embodiment, a single-photon source of the invention can be operated at a source-drain current that is orders of magnitude lower than the lowest reported by others (Muller, Kinoshita et al. 2010; Pyatkov et al. 2016; Khasminskava et al. 2016).

In another embodiment, extra electrons or holes can be injected into the nanotube hosts to synthesize trions at the organic color-centers. By definition, a trion is a bound state composed of two electrons and one hole, or vice versa, therefore demonstrating non-zero spin for spin manipulation. (Wolf, Awschalom et al. 2001; Galland and Imamoglu 2008) The incorporation of organic color-center defects in nanotubes is known to help stabilize trions, resulting in ultrabright trion photoluminescence at a further redshifted wavelength. (Brozena, Leeds et al. 2014; Kwon, Kim et al. 2018) The ability to electrically inject extra electrons or holes to create trions at the trapping organic color-centers allow electron spin to be coupled to single photons in a solid electronic device enabling even more sophisticated quantum functionalities that can be driven electrically.

Exemplary Single-Photon Sources

Figure 2:
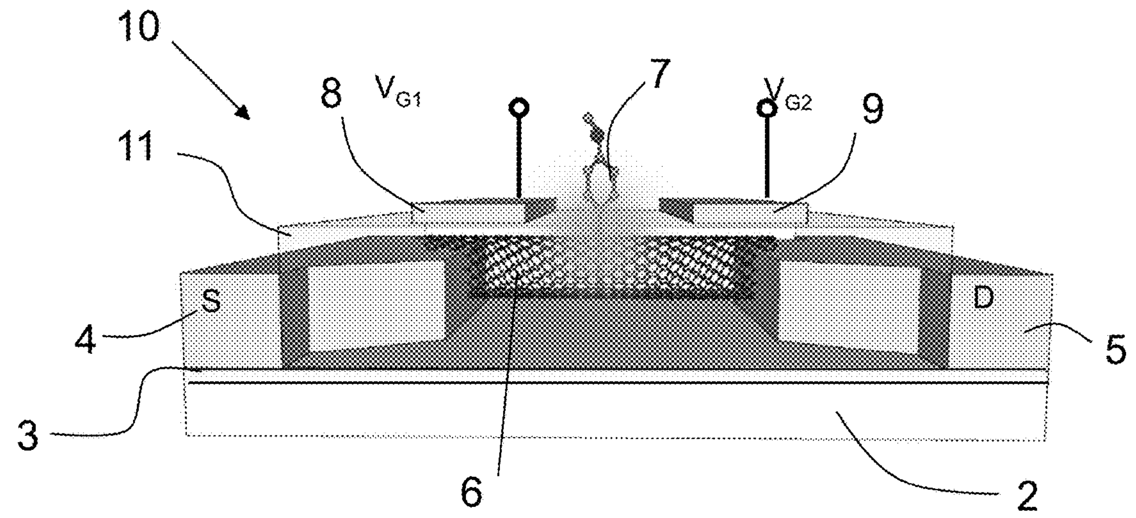
FIG. 2 is a schematic illustration of an exemplary single-photon source of the invention. The illustrated device is a top-gated electrically driven single-photon source including a color center introduced into a semiconducting nanotube. The illustrated device employs a split gate configuration along the elongated dimension of the carbon nanotube color center host. Electrons and holes recombinant at the color center to generate the single photon.

FIG. 2 illustrates an exemplary top-gated electrically driven single-photon source (10) based on a color center host (6) carrying one or two color centers (7), a single color center is shown. In an embodiment, the single-photon source is implemented with a semiconducting carbon nanotube carrying an organic color center. In an embodiment, the source is created on a non-conductive substrate (2), such as quartz or glass. The source comprises electrodes configured to allow controlled electrical injection of small numbers of low-energy electrons and holes to be separately injected separately into the color center to produce single-photon emission. In embodiments, the number of electrons or holes separately injected ranges from 0 to $10^{-10}$ per color center/second. In embodiments, the electrons and holes are low energy ranging from 0.5 to 1.5 eV.

In an embodiment, the source comprises a source (4) and a drain (5) electrode mounted on the substrate and the semiconducting color center host (6) is electrically connected across the source (4) and drain (5) electrodes. The semiconducting color center can, for example, be suspended between the electrodes over a trench positioned between the source and drain electrodes. Electrons and holes can be separately injected into the semiconducting color center host (6) as known in the art through the source (4) and drain (5) electrodes. The device is provided with a first (8) and a second (9) gate electrode which are not in electrical contact with the semiconducting color center (6) or the source or drain electrodes (4 and 5, respectively). A potential is selectively applied to the first and second gate electrodes (8 and 9) to control the injection of electrons and holes into the semiconducting color center host (6). Electron/hole pairs are localized at the color center (7) where they recombine to generate emission (designated $E_{11}^{-}$). This emission is a single photon at a wavelength characteristic of the color center and the semiconducting host.

The controlled injection of electrons and holes is achieved by using voltage stabilized sources, such as those from a Keithley 4200 semiconductor characterization system (Keithley Instrument Inc.) for gating and current sourcing, or current limiting circuits that can be directly integrated with the invented devices, as established in the semiconductor industry.

The source and drain electrodes of the single-photon source can be any configuration for such electrodes known in the art and wherein the nanoscale color center host is electrically connected to such source and drain electrodes by any configuration or method known in the art. For example, the source and drain electrodes can be formed by methods known in the art for forming semiconductor devices. In an embodiment, a trench is formed between the source and drain electrodes and the nanoscale color center host is suspended across the trench in electrical contact with the source and drain electrodes. The color center is positioned between the source and drain electrodes such that electrons or holes can be injected into the color center host and the color center. The color center host can be positioned with respect to the source and drain electrodes by, for example, being grown in place using chemical vapor deposition, or being deposited in place by any other method known in the art for placement of nanoscale species, such as carbon nanostructures, particularly carbon nanotubes or graphene nanoribbons.

The photon source has at least two gate electrodes in a split gate configuration, as illustrated in FIG. 2. The gate electrodes are positioned with respect to the color center host and the color center to produce a p-electrostatically doped region on one side of the color center in the color center host and an n-doped on the other side of the color center in the semiconducting color center host. An optional third gate electrode is provided that is insulated from and directly applied on the color center. The optional third gate can be used to tune the energy level of the color center with respect to the source and drain electrodes.

To facilitate single photon emission, the voltage applied through the source and drain electrodes across the color center is preferably −0.1 to +0.50 eV with respect to the photon energy of the single photons that would emit by electron/hole recombination at the color center. The photon energy of a single photon depends at least in part on the chemical nature of the color center. The photon energy (wavelength) of a given color center in a given color center host can be determined by art-known methods. In an embodiment, the voltage applied through the source and drain electrodes across the color center is between 0 and 0.50 eV with respect to the photon energy of the single photons that would emit by electron/hole recombination at the color center. In a related embodiment, the voltage applied through the source and drain electrodes across the color center ranges from −0.050 to +0.25 eV with respect to the photon energy of the single photons that emit by electron/hole recombination at the color center. In another embodiment, the voltage applied through the source and drain electrodes across the color center ranges from −0.01 to +0.05 eV with respect to the photon energy of the single photons that emit by electron/hole recombination at the color center. In an embodiment, the voltage applied through the source and drain electrodes across the color center is equal to or at most 30 meV less than the photon energy of the single photons that would emit by electron/hole recombination at the color center. In an embodiment, the voltage applied through the source and drain electrodes across the color center is equal to or at most 10 meV less than the photon energy of the single photons that would emit by electron/hole recombination at the color center.

To facilitate single photon emission, the current of electrons or holes applied across each color center through the source and drain electrodes is preferably less than 1 nano ampere ($1\times10^{-9}$ amp) per color center. In an embodiment, the current applied across each color center is in the range of $1\times10^{-7}$ to $1\times10^{-9}$ ampere per color center. In an embodiment, the current of electrons or holes applied across each color center is between $1\times10^{-16}$ amp and $1\times10^{-10}$ amp. In a more preferred embodiment, the current applied across each color center is between $1\times10^{-12}$ amp and $1\times10^{-10}$ amp. In a more specific embodiment, the current applied across each color center is on the order of $1\times10^{-11}$ ampere (0.01 namp) per color center. In a more specific embodiment, the current applied across each color center is $1\times10^{-1}$ ampere (0.01 namp)+/−10% per color center.

In an embodiment, the relative number of electrons and holes injected to obtain single photon emission is about the same. The relative ratio of electrons to holes is adjusted by application of selected potential to the gate electrodes as is known in the art. In an embodiment, the relative ratio of electrons to holes ranges from 0.5 to 1.5. In a more specific embodiment, the relative ratio of electrons to holes injected is 1+/−0.05% and single photon generation involves radiative recombination of an electron and a hole.

U.S. Pat. No. 7,141,727 describes a source/drain and gate electrode structure for use in preparation of field-effect transistors employing carbon nanotubes. This patent is incorporated by reference herein in its entirety for descriptions of the preparation of such electrode structures.

In an alternative embodiment, the relative number of electrons to holes is other than equal to result in the production of trions. A trion consists of three charged particles, two electrons and a hole (negative trion) or two holes and one electron (positive trion). Trions formed in the source are localized at the color center and emit a single photon. The wavelength of the photon emitted from the trion at the color center is different from that of single photons formed by recombination of an electron and hole at the color center and typically is at longer wavelength. In an embodiment, the ratio of electrons to holes is greater than or equal to 1.1 or less than or equal to 0.9 resulting in the production of trapped trions and generation of single-photons from theses localized trions.

Figure 3:
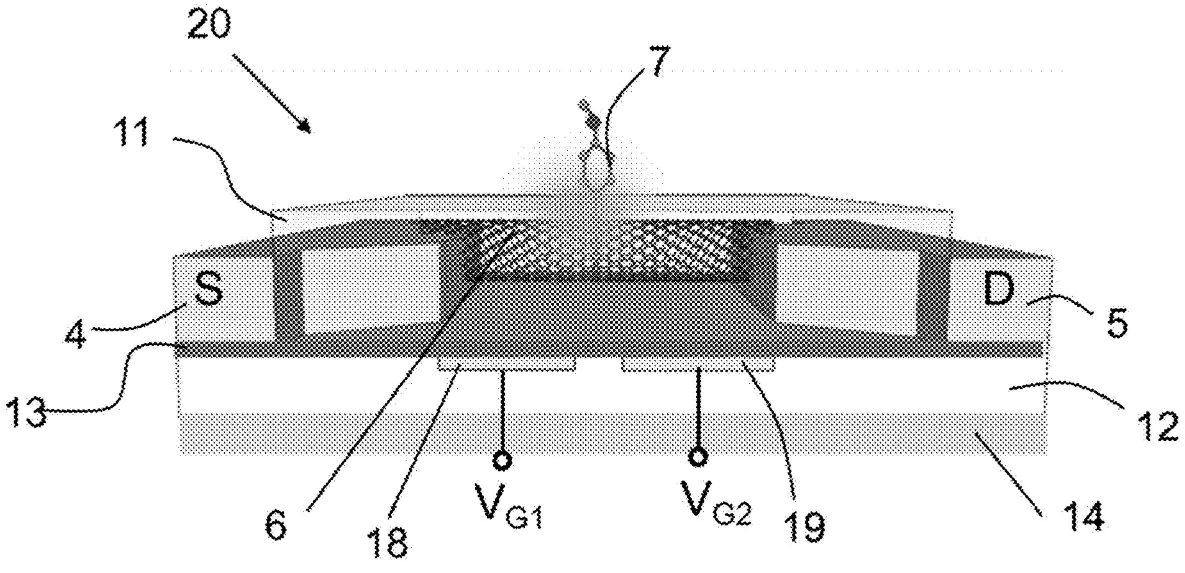
FIG. 3 is a schematic illustration of another exemplary single-photon source of the invention. The illustrated device is a bottom-gated electrically driven single-photon source including a color center introduced into a semiconducting nanotube. The illustrated device employs a split gate configuration along the elongated dimension of the carbon nanotube color center host. Electrons and holes recombinant at the color center to generate the single photon.

FIG. 3 illustrates an exemplary bottom-gated electrically driven single-photon source (20) based on a color center host (6) carrying one or two color centers (7), a single color center is shown. The photon source is shown as mounted or formed on a silicon dioxide ($SiO_2$) layer (12) and a silica (Si) layer (14) for facile integration into or with semiconductor circuits and related devices. In this case, the device is provided with an insulating layer (13) between the substrate (12) and the source and drain electrodes (4 and 5, respectively). The gate electrodes (18 and 19) are positioned below and insulated from the source and drain electrodes. The gate electrodes are shown in a split configuration. As described for the device of FIG. 2 an optional third gate electrode may be positioned below the color center. The color center host (6), illustrated as a carbon nanotube is electrically connected between the source and drain electrodes. A single color center (7) is illustrated in the color center host.

The single-photon source of FIG. 3 is operated analogously to that of FIG. 2 for the injection of electrons and holes, separately, for recombination of an electron and hole at the color center for generation of a single photon. Again as discussed for photon source of FIG. 2, the photon source of FIG. 3 can be operated for single photon emission via trion formation.

U.S. Pat. Nos. 7,141,727, 8,373,157, and 10,316,247 are each incorporated by reference herein in its entirety for description of methods for making devices and certain device structures which incorporated carbon nanotubes. Methods and device structures in these patents can be employed or readily adapted in view of the descriptions herein to prepare devices of the present invention.

In embodiments, the photon source of the invention is provided with cooling or a temperature control device. A variety of cooling or temperature control devices suitable for use with such devices is known in the art. For example, the photon source can be thermoelectrically cooled. In specific embodiments, the photon source is cooled from 0 K to 230 K. In an embodiment, the photon source is cooled from 77 K to 230 K. In an embodiment, the photon source is cooled to a temperature from 77K to 180 K. In an embodiment, the photon source is cooled to a temperature from 77K to 100 K. In an embodiment, the photon source is temperature controlled by any appropriate device or method configuration known in the art to a selected temperature (in degrees K). In specific embodiments, the photon source is temperature controlled to a selected temperature in degree K to within a range of +/−5 degrees K. In a more specific embodiment, the photon source is temperature controlled to a selected temperature (in degrees K) within a range of +/−1 degrees K.

The photon source can be provided with inert protective coatings as is known in the art. A top protective coating (11), for example of $Al_2O_3$, is shown in the devices of FIG. 2 and FIG. 3. A similar protective coating (3), for example, of $Al_2O_3$ is optionally provided between the substrate and the source and drain electrodes in the device of FIG. 2. In the device of FIG. 3, an insulating layer (13), such as an $HfO_2$ layer, is provided between the source and drain electrodes and the substrate in the device of FIG. 3. Tis insulating layer can also provide protection.

Any protective coating provided is an inert coating which may coat only a portion or all of the photon source to protect the components therein. The protective coating is provided such that the single photon can be emitted from the source. The protective coating can, for example, be a polymer or resin coating or an oxide or nitride coating. In an embodiment, the protective coating reduces or prevents charge noise and environmental fluctuations. In an embodiment, the protective coating provided electrical insulation. In an embodiment, the protective coating is selected from polystyrene, $HfO_2$, $Al_2O_3$, boron nitride or a combination thereof.

It is also possible to achieve a nearly charge free environment by spin-coating a thin-layer of polystyrene layer on a silicon substrate or selectively grow $Al_2O_3$ protective layers as a means to control possible environmental fluctuations.

Figure 4A:
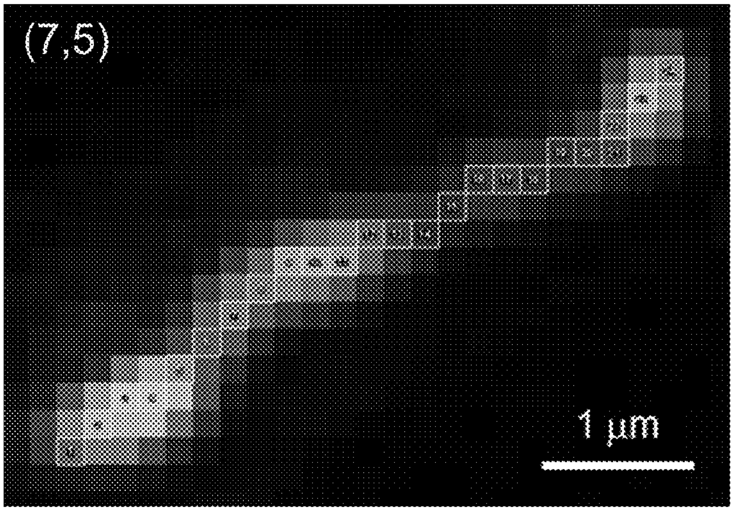
FIGS. 4A-D illustrate optical generation of emission from a semiconducting nanotube which is modified to include an organic color center. The organic color center includes an exemplary aminoaryl group which is covalently bonded within a (3,5)-SWCNT.
Figure 4B:
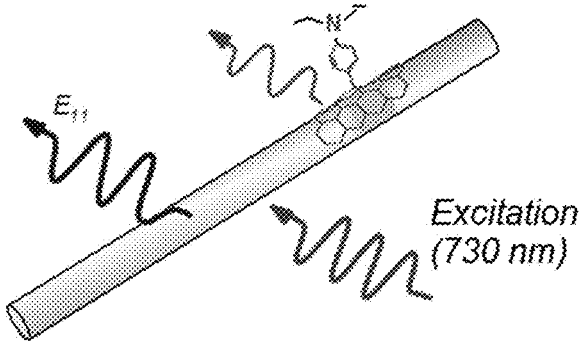
Figure 4C:
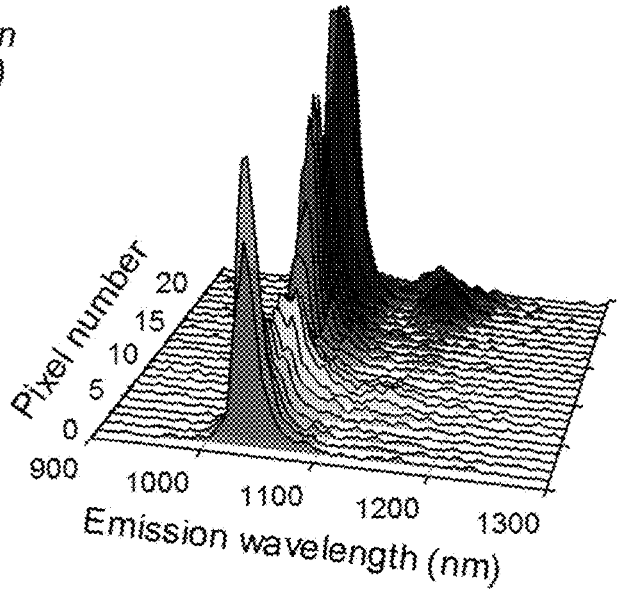
Figure 4D:
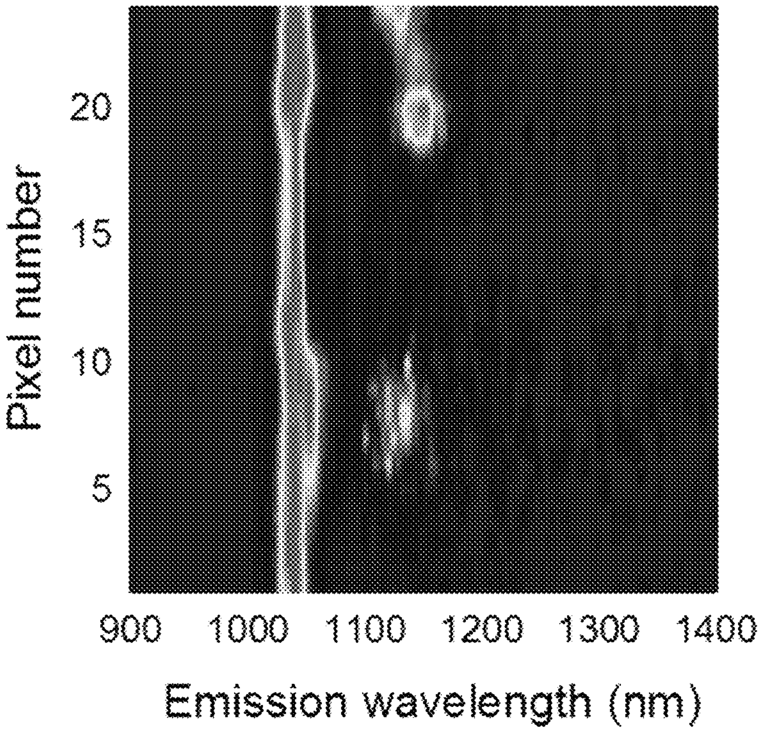

The single photons source of the invention relies on electrical generation of single photons implemented by injection of electrons and holes which recombine to generate the single photon emission. The principle behind this type of single electron photon emission is illustrated in FIG. 1. In contrast, FIGS. 4A-D illustrate photon generation ($E_{11}^-$) from nanotubes carrying organic color centers (OCC), for example an OCC carrying an aryl amine. FIG. 4A is a broadband fluorescence image of a single-walled carbon nanotube (SWCNT), specifically a (7,5)-SWCNT, chemically modified to carry such an organic color center. The optical excitation scheme is illustrated in FIG. 4B. Irradiation of the SWCNT with color center as shown result in generation typical $E_{11}$ emission from the SWCNT as well as $E_{11}^-$ emission from the color center. This is shown in the spatially resolved emission generated by optical excitation which shows $E_{11}$ photoluminescence (PL) and emission form the OCC. In FIG. 4C each pixel is 121 nm wide. $E_{11}$ emission is along the length of the SWCNT and $E_{11}^-$ is localized from the OCC. This is further illustrated in the spatially and spectrally resolved fluorescence image of the OCC in the SWCNT (FIG. 4D). The localized emission is observed as “hot spots” along the nanotube host, with the full spectrum simultaneously resolved for each pixel.

Figures 5A, 5B, 5C:
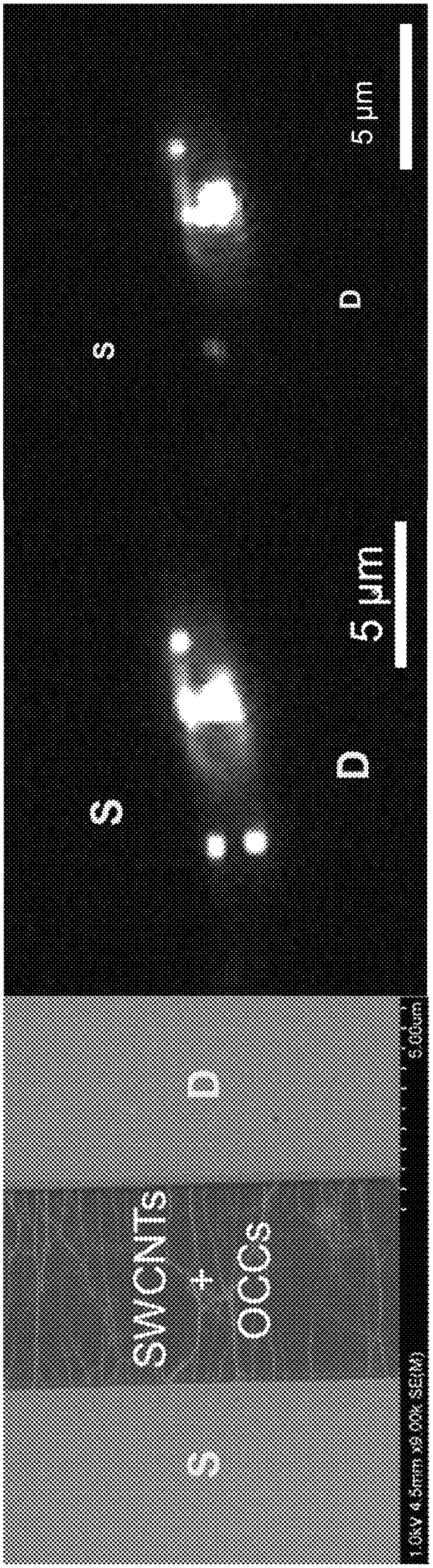
FIGS. 5A-C schematically illustrate and compare electroluminescence from organic color centers in SWCNTs hosts by optical excitation and by impact excitation.

In contrast, FIGS. 5A-5C illustrate electroluminescence from an OCC (again in a SWCNT) by impact excitation. FIG. 5A is a scanning electron microscopy (SEM) image showing the OCC-containing SWCNT across source (S) and drain (D) electrodes. S and D in the figures represent the source and drain electrodes, respectively. The SWCNTs are subjected to optical excitation (photoluminescence) and impact excitation (electroluminescence). Electroluminescence is generated by applying a source-drain voltage across the nanotube host. FIGS. 5B and 5C illustrate photoluminescence and electroluminescence, respectively, and show the difference in emission. Electroluminescence is shown to be more confined to the color center.

Color Center Hosts and Color Centers

The sources and sensors of this invention employ color center hosts carrying color centers. The color center host is a nanoscale species in which a color center can be generated. Injection of electrons and holes into such host are carried to the color centers therein. Electrons and holes localize to the color center and recombine to generate single photons. Alternatively, trions formed by injection of excess electrons or excess hole localize to the color center and emit. In an embodiment the nanoscale color center host is a carbon nanostructure which has a sp2 lattice. Carbon nanostructures with such a lattice include among others carbon nanotubes or graphene nanoribbons. In embodiments, the carbon nanostructure are semiconducting carbon nanostructures, including, among others, semiconducting carbon nanotubes and semiconducting graphene ribbons. Carbon nanotubes include single-walled carbon nanotubes (SWCNT), double-walled carbon nanotubes (DWCNT) or multi-walled carbon nanotubes (MWCNT), with SWCNT being presently preferred.

Various carbon nanostructures including SWCNT, MWCNT, cylinders/spheres, sheets, rods or other structures are known and can be prepared by known methods. Carbon nanotubes are particularly well-studied and can be synthesized by carbon arcs, laser deposition and ion bombardment, among others known methods, and are now in some cases commercially available. Graphene nanoribbons are strips of graphene with width less than 50 nm. Graphene nanoribbons can be produced by graphite nanotomy, by axial cutting of carbon nanotubes or grown by ion implantation on SiC substrates. Graphene nanoribbons can be grown on SiC wafers or grown on germanium wafers using chemical deposition. Carbon nanotubes and graphene ribbons have a sp2 carbon lattice. Color centers can be introduced by replacing carbon atoms in this lattice with nitrogen or boron atoms. Color centers can also be introduced into such a lattice by formation of C—C bonds between organic functional groups and one or more carbons in the lattice. Color centers which are formed by covalent bonding of such organic functional groups into the lattice are called organic color centers. U.S. Pat. No. 9,983,058 and published U.S. application 20180265779 provide examples of organic color center formed in carbon nanotubes and provide methods for making such color centers. Each of these patent documents is incorporated by reference herein in its entirety for description of such color centers and methods. Analogous methods can be applied to introduce organic color centers into graphene nanoribbons.

In embodiments, the carbon nanotube host has small diameter less than about 1 nm or less than about 0.5 nm. In some embodiments, the carbon nanotube host has large diameter of more than about 2 nm. In some embodiments, the carbon nanotube has an intermediate diameter ranging from more than 1 nm to less than 2 nm. More specifically a carbon nanotube can have diameter ranging from 0.5 nm to 1.6 nm.

In an embodiment, the nanoscale host is a carbon nanoscale host having a $sp^2$ carbon lattice. In an embodiment, the color center is formed by covalent bonding to the nanoscale color center host. In an embodiment, the color center is formed by covalent bonding of one or two chemical functional groups to the $sp^2$ lattice of the nanoscale color center host. In an embodiment, the color center is formed by covalent bonding of one or two monovalent functional groups to the sp2 lattice of the nanoscale host. In an embodiment, the color center is formed by covalent bonding of a divalent functional group to the sp2 lattice of the nanoscale host. In an embodiment, the color center is formed through formation of one or two C—C bonds.

In an embodiment, the organic functional groups bound to the carbon lattice of carbon nanostructures do not themselves emit. The emission observed relates to the defect formed in the carbon lattice by introduction of the organic functional groups.

Figure 12:
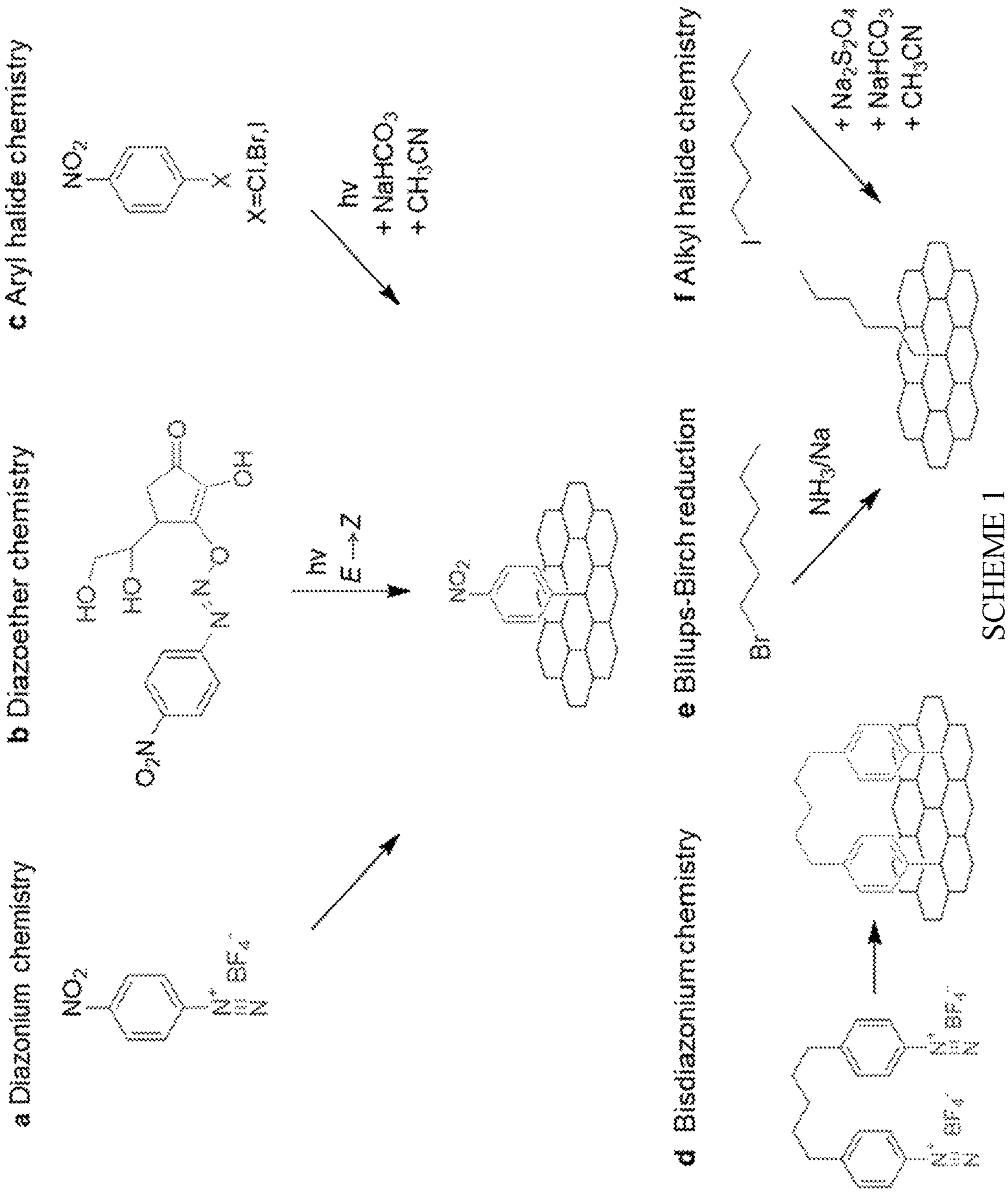
FIG. 12 illustrates Scheme 1 showing various exemplary methods for introduction of an organic color center. Methods illustrated in Scheme 1 include diazonium chemistry, diazoether chemistry, aryl halide chemistry (arylation), alkyl halide chemistry (alkylation), bisdiazonium chemistry and the Billups-Birch reaction.
Figure 13:
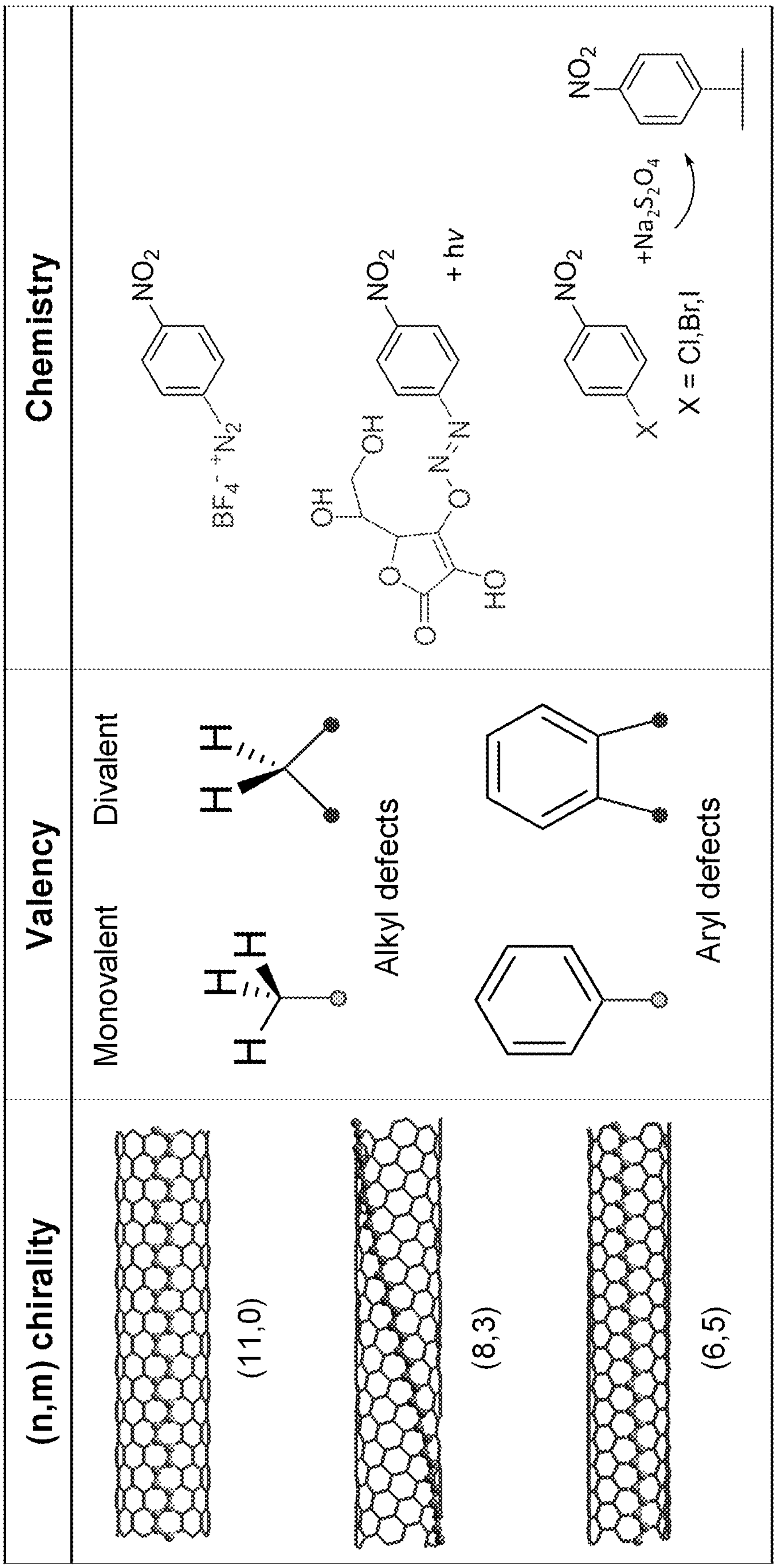
FIG. 13 illustrates Scheme 2 showing additional types of color centers of different structure and valency that can be introduced into carbon nanostructures.

In specific embodiments, color centers are formed by alkylation or arylation reactions with the carbon lattice, for example as described in U.S. Pat. No. 9,983,058. Scheme 1 illustrates various exemplary methods for introduction of an organic color center (FIG. 12). Scheme 2 illustrates additional types of color centers of different structure and valency that can be introduced into carbon nanostructures (FIG. 13). FIG. 2 notes examples of carbon nanotubes characterized by (n, m) chirality (FIG. 13). This carbon nanotube nomenclature is well known and generally used in the art to distinguish carbon nanotube structures. In general, carbon nanotubes of any such known chirality can be employed in the devices and methods herein. In specific embodiments, semiconducting carbon nanotubes of any such known chirality can be employed for sources and sensors herein. In specific embodiments, carbon nanotubes of chirality (10,0), (11,0), (13,0), (14,0), (16,0), (17,0), (11,1), (12,1), (14,1), (15,1), (8,7), (9,7), (9,8), (5,4), (6, 4), (7, 3), (9,1), (6,5), (8, 3), (7, 5), (9, 4), (7, 6), (9, 4), (11, 1) and (10, 3) can be used.

In specific embodiments carbon nanotubes of chirality (10,0), (11,0), (13,0), (14,0), (16,0), (17,0), (11,1), (12,1), (14,1), (15,1), (8,7), (9,7), or (9,8) can be used in particular in applications to single-photon sources herein. For applications to sensors, in specific embodiments, carbon nanotubes of chirality (5,4), (6, 4), (7, 3), (9,1), (6,5), (8, 3), (7, 5), (9, 4), (7, 6), (9, 4), (11, 1) and (10, 3) can be employed.

Monovalent organic functional groups useful in devices and methods herein include optionally substituted alkyl and optionally substituted aryl groups. Alkyl groups include straight-chain or branched alkyl groups. Alkyl groups can generally include 1-20 carbon atoms and more specifically 1-6 carbon atoms. Alkyl groups also include cycloalkyl groups which contain a 3-12 member carbon ring and more preferably contain a 3-6 member carbon ring. Aryl groups contain on or more aromatic rings, such as a phenyl ring, a naphthyl ring or a biphenyl ring. Optional substitution of alkyl or aryl groups includes substitution with one or more halogens, particularly one or more fluorines, one or more amino groups ($—NH_2$) or alkylated amino groups ($—N(R_N)_2$), which may be protonated ($—N(R_N)_2H^+$) where $R_N$ is H or an alkyl group, one or more carboxylic acid or carboxylate groups (—COOH, $—COO^-$), one or more thiol (—SH) groups, or one or more nitro, cyano or other electronegative group. Optional substitution of aryl groups includes substitution with one or more alkyl groups which in turn may be optionally substituted, particularly with fluorine. Optional substitution of alkyl groups includes substitution with one or more aryl groups, particularly phenyl groups, which in turn are optionally substituted, particularly with fluorine. In specific embodiments, the monovalent organic functional group is an alky or aryl group, such as a phenyl group, substituted with an amino group, protonated amino group or a carboxylate or carboxylic acid group. In such an embodiment, the amino group or carboxylate group may be used to covalent bond other functional groups of interest into the color center, including complexing groups, chelating agents, proteins, peptides, oligopeptides, sugars (including monosaccharides and disaccharides), oligonucleotides or other functional group useful in sensing applications as described herein. In a specific embodiment, the monovalent organic functional group is an alkyl, or aryl group substituted with a thiol group. Such monovalent groups can be used to form dithiol bonds with species in the local environment. In a specific embodiment, the monovalent functional group is a fluorinated, including a perfluorinated alkyl or aryl group. Examples of monovalent functional groups are provided in Schemes 1, 2 (FIGS. 12 and 13) and FIG. 6 as well as in Tables 2, 3 and 4 of each of U.S. Pat. No. 9,983,058 and published U.S. application 20180265779.

Figure 6:
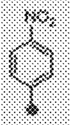
FIG. 6 is a Table illustrating chemical tunability of organic color center photoluminescence (PL) for exemplary chemical moieties including examples of covalently bound monovalent and divalent moieties bound to SWNCTs. SWCTS are identified by the customarily used (n, m) nomenclature. The wavelength of emission from the color center depends upon the chemical moiety bound to the carbon nanotube and the structure of the SWNCT.
Figure 6:
Figure 6:
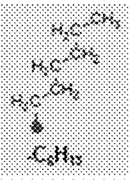
Figure 6:
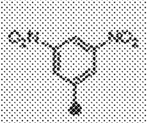
Figure 6:
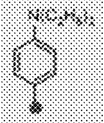
Figure 6:
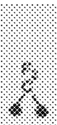

FIG. 6 is a Table showing the tenability of PL of organic color centers in (n,m) SWNTs. The figure provides emission wavelengths of exemplary organic color center combinations with certain SWNTs.

In specific embodiment, the functional group bonded to the carbon lattice to form the color center is a divalent group $>C(R_M)_2$, where $R_M$ is independently an optionally substituted alkyl group, an optionally substituted aryl group, or a halogen, particularly a fluorine. The two $R_M$ together can also represent a cyclic alkyl or a cyclic aryl group that is optionally substituted. Optional substitution of alkyl or aryl groups includes substitution with one or more halogens, particularly one or more fluorines, one or more amino groups ($—NH_2$) or alkylated amino groups ($—N(R_N)_2$), which may be protonated ($—N(R_N)_2H^+$) where $R_N$ is H or an alkyl group, one or more carboxylic acid or carboxylate groups (—COOH, $—COO^-$), one or more thiol (—SH)

groups, or one or more nitro, cyano or other electronegative group. Optional substitution of aryl groups includes substitution with one or more alkyl groups which in turn may be optionally substituted, particularly with fluorine. Optional substitution of alkyl groups includes substitution with one or more aryl groups. More specific examples of divalent groups include $>C(R)_2$ where R is independently H or F or $>C_6(R)_4$, where R is independently H, fluorine. The divalent group $>C_6(R)_4$ is more specifically illustrated as:

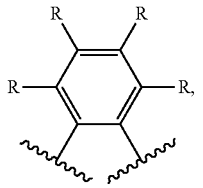

where R takes any value of $R_M$ above and in specific embodiments is independently H or F. Color centers described herein can be prepared by art known methods or routine adaptation of art known methods. Examples of monovalent functional groups are provided in Schemes 1, 2 (FIGS. 12 and 13) and FIG. 6 as well as in Tables 2, 3 and 4 of each of U.S. Pat. No. 9,983,058 and published U.S. application 20180265779.

In an embodiment, the color center of the invention is introduced into a carbon nanostructure by covalent bonding of organic functional groups to the carbon lattice of the carbon nanostructure. In embodiments, the carbon nanostructure color center hosts used in the invention are not prepared by adherence of an atom, molecule, atomic layer, or molecular layer to a carbon nanostructure surface. In an embodiment, the carbon nanostructure color center hosts used in the invention are not prepared by absorption or deposition of an atom, molecule, inorganic or organic substance of an atomic or molecular layer, a metal, semiconductor or an insulator on the inside surface of a carbon nanotube. In an embodiment, the carbon nanostructure color center hosts used in the invention are not prepared by absorption to or deposition on a surface of or inside of a carbon nanotube of any substance nor encapsulation of the carbon nanotube by any substance. In an embodiment, the carbon nanostructure color center hosts used in the invention do not contain a clean portion free of adsorption, deposition or encapsulation and a portion upon which an atom, molecule, inorganic or organic substance of an atomic or molecular layer, a metal, semiconductor or an insulator is absorbed or deposited or a portion encapsulated by such species. In an embodiment, the carbon nanostructure color center hosts used in the invention are free of an encapsulating substance. In an embodiment, the carbon nanostructure color center hosts used in the invention are free of any alumina deposition.

Optoelectronic Sensors

Semiconducting SWCNTs exhibit characteristic shortwave-IR photoluminescence (PL) that may be useful for bioimaging and sensing applications. The PL of SWNCT's is in the tissue transparent window particularly useful for bioimaging and the emission has a remarkably narrow line shape (full width at half maximum~23 meV at room temperature). SWCNTs are photostable and do not photobleach under prolonged excitation. However, the PL quantum yield is very low in these nanostructures (typically <1%). By instead channeling excitons to $sp^3$ quantum defects, Nanotube PL becomes substantially brighter (by as high as 28-fold) in nanotubes carrying sp3 quantum defects. (Kwon et al. 2016; Piao et al. 2013). This brightening effect is believed to arise from normally dark excitons being directed to and radiatively recombining at the optically allowed defect state. The optoelectronic sensors of this invention are at least in part based on the concept that excitons trapped at these defects will respond sensitively to chemical events occurring at the defect site because of the amplification effects of the nanotube, which acts like an antenna efficiently absorbing and harvesting light, and channeling the generated excitons to the defect site, where the excitons recombine to produce bright shortwave infrared (IR) photoluminescence (PL). The defect PL has been found to be molecularly tunable by varying the functional groups employed to form the sp3 defects (see, for example, the Table and structures in FIG. 6.)

The PL arises from the defects in the carbon nanotube wall, not from the functional groups covalently bonded to form the defect, but the defect encodes chemical information associated with the functional groups used to form the detect. The chemical information encoded in the defect includes any sites for proteination or deproteination, any sites for molecular complexation or decomplexation and any reactive sites in the chemical moieties in the covalently formed defect. Given the diverse nanotube structures, known as (n,m) chiralities. (Tu et al. 2009), the wide available of molecular functional groups, and the various known chemistry for covalent bonding to form C—C bonds and more specifically for forming such bonds in the side wall of carbon nanotubes, a very large variety of shortwave IR quantum emitters can be rationally designed and synthesized using such known methods. Such emitters are useful for applications including in vivo bioimaging (Hong et al. 2015) and chemical sensing (Heller et al. 2006). Such emitters include semiconducting color center hosts as described herein. Such emitters can be used to enhance the chemical selectivity of sensors employing SWCNTs by chemically tailoring the organic color center. The properties of such emitter for use as sensors can for example be tailored by varying the valency of the covalent bond(s) forms, e.g. generating monovalent or divalent defects, and by varying the defect chemistry that may involve different reaction mechanisms. When carbon nanotubes are employed as the color center hosts the emitter can be further tailored by use of carbon nanotubes of different chiralities, for example those that give different lattice symmetries.

Exemplary variations in chirality of carbon nanotubes, valency and color center chemistry is illustrates in Schemes 1 (FIG. 12) and 2 (FIG. 13). Exemplary methods for forming organic color centers are illustrated in Scheme 1. Methods illustrated in Scheme 1 include diazonium chemistry, diazoether chemistry, aryl halide chemistry (arylation), alkyl halide chemistry (alkylation), bisdiazonium chemistry and the Billups-Birch reaction.

U.S. Pat. No. 9,983,058 and published U.S. application 20180265779 provide examples of organic color center formed in carbon nanotubes and provide methods for making such color centers. Each of these patent documents is incorporated by reference herein in its entirety for description of such color centers and methods.

In an aspect, the invention relates to optoelectronic chemical sensors in which semiconducting color center hosts, particularly, carbon nanotube hosts incorporating organic color centers function as chemically specific probes.

Figure 7:
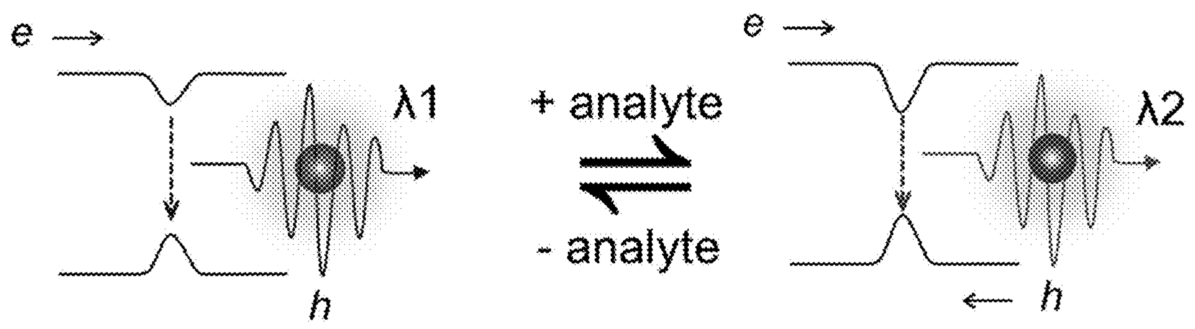
FIG. 7 is an illustration of a working principle of an optoelectronic chemical sensor of the invention. The figure shows the electronic band structure of the color center created in the semiconducting color center host (left side). Electrons (e) and holes (h) are shown as separately injected into the color center from different directions along a dimension of the semiconducting color center host. As described in FIG. 1, electrons and holes recombine to emit a photon of wavelength $\lambda 1$. Interaction with an analyte, as schematically shown, affects (influences) the electronic band structure of the color center and affects the photon emitted on electron/hole recombination. The affect is illustrated on the right side of FIG. 7 as a change in wavelength ($\lambda 2$) of the photon emitted. It will be appreciated that the effect of analyte interaction may be a change in emission intensity or another measureable property of the photon emitted, such as a change in emission peak shape (e.g., full width at half maximum) or a change in fluorescent lifetime of emission. It will also be appreciated that the analyte may be any chemical species that induces a measurable effect on emission at the color center. Further, it will be appreciated that emission of the color center may be affected by an environmental property such as a temperature change.

FIG. 7 is an illustration of a working principle of an optoelectronic chemical sensor of the invention. The figure shows the electronic band structure of the color center created in the semiconducting color center host (left side). Electrons (e) and holes (h) are shown as separately injected into the color center from different direction along a dimension of the semiconducting color center host. As described in FIG. 1, electrons and holes recombine to emit a photon of wavelength λ1. Chemical events at the color center, for example, interaction with an analyte, as schematically shown in FIG. 7, affect the electronic band structure of the color center and affect the photon emitted on electron/hole recombination. The effect of the analyte is illustrated on the right side of FIG. 7 as a change in wavelength (λ2) of the photon emitted. This change in wavelength is detected to detect the analyte. Alternatively, a change in emission intensity is induced by the analyte and this change in intensity is detected to detect the analyte. Additional, for a given analyte, a change in more than one characteristic of the emission may occur on interaction with the analyte. For example, both wavelength and intensity of emission may be affected. Any changes in photon emission due to the presence of an analyte can be detected or in an embodiment such changes can determined quantitatively.

Thus, the effect of analyte interaction with the color center may be a change in wavelength, emission intensity or any other measureable property of the photon emitted, or a combination of such changes. In addition to wavelength and emission intensity, emission peak shape (e.g., full width at half maximum) and emission lifetime may be affected. In a preferred embodiment, the change affected is a change in wavelength, a change in emission intensity or both. It will also be appreciated that the analyte may be any chemical species that induces a measurable effect on emission at the color center. Because, the photon emission can be affected by a temperature change, in an embodiment, for detection of analytes, the sensors of the invention are optionally provided with temperature control. In general, the sensors of the invention are operated at a temperature range from 230 to 373K. In a preferred embodiment, the sensors of the invention are operated at room temperature (293 to 298 K) or higher.

Figure 8:
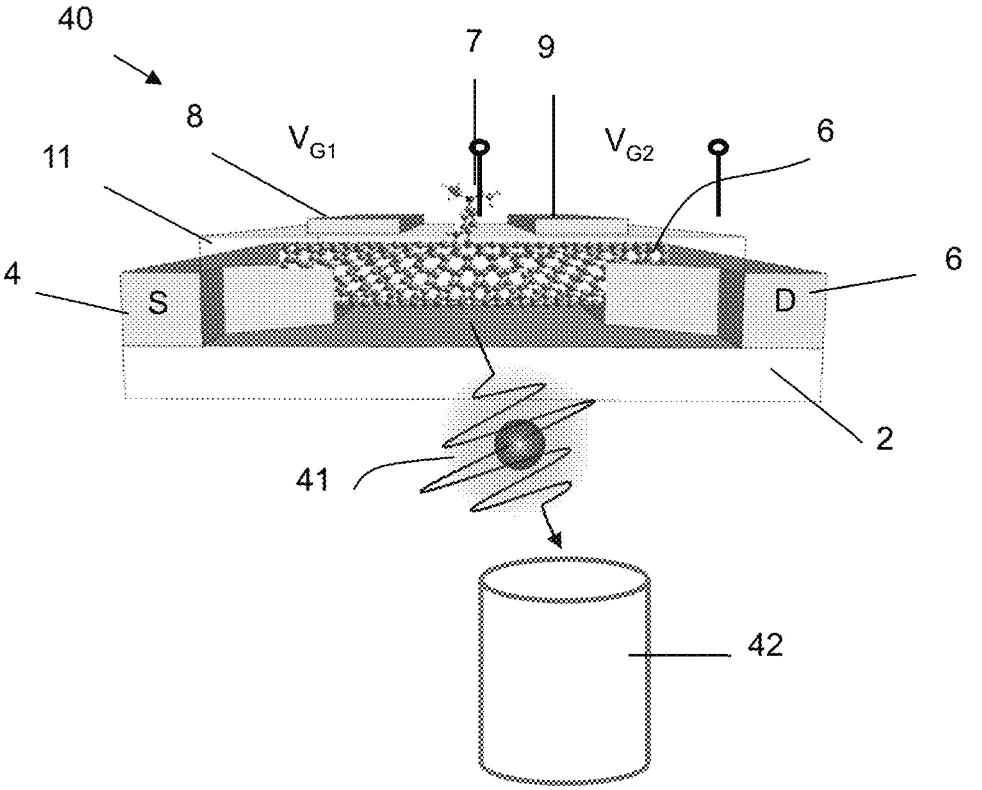
FIG. 8 is a schematic illustration of an exemplary chemical sensor for the invention. The illustrated sensor is based on the single-photon source configuration of FIG. 2. The sensor includes a photodetector or related detector for detection of a change in emission of photons from the color center. Emission from the device is affected, for example, by interaction of the color center with an analyte or a change in an environmental property, such a local temperature change. The sensor is exemplified as employing single photon emission from the device. It will be appreciated, that the operation of such a sensor is not necessarily dependent upon the generation of single photon emission. The device may be implemented with a plurality of carbon nanotubes carrying the same color center. In such an implementation the semiconducting color center host may comprises a plurality of such hosts each emitting photons where emission from at least a portion of the semiconducting color centers is affected by the analyte or environmental property. An alternative sensor configuration can be analogously based on the single-photon source of FIG. 3 by inclusion of an appropriate detector.

FIG. 8 is a schematic illustration of an exemplary chemical sensor (40) of the invention. The sensor illustrated is based on the single-photon source configuration of FIG. 2. Many of the device elements of the sensor are described as for the device elements of the photon source of FIG. 2. The sensor in addition includes a detector (42) which can be a photodetector or related detector for detection of a change in emission of photons from the color center. Emission (41) from the device is affected, for example, by interaction of the color center with an analyte or a change in an environmental property such a temperature. The sensor of FIG. 8 employs a split gate configuration and electrons and holes are separately injected in to the color center from the source and drain. A top gat configuration is illustrated. A bottom gate configuration can also be employed as is illustrated and described for the photon source of FIG. 3 by inclusion of an appropriate detector.

The sensor of FIG. 8 is exemplified as employing single photon emission from the device. It will be appreciated, that the operation of such a sensor is not necessarily dependent upon the generation of single photon emission. The device may be implemented with a plurality of semiconductor color center hosts, e.g. a plurality of carbon nanotubes carrying the same color center. In such an implementation the semiconducting color center host may comprise a plurality of such hosts each emitting photons where emission from at least a portion of the semiconducting color centers is affected by the analyte or environmental property.

Figure 9:
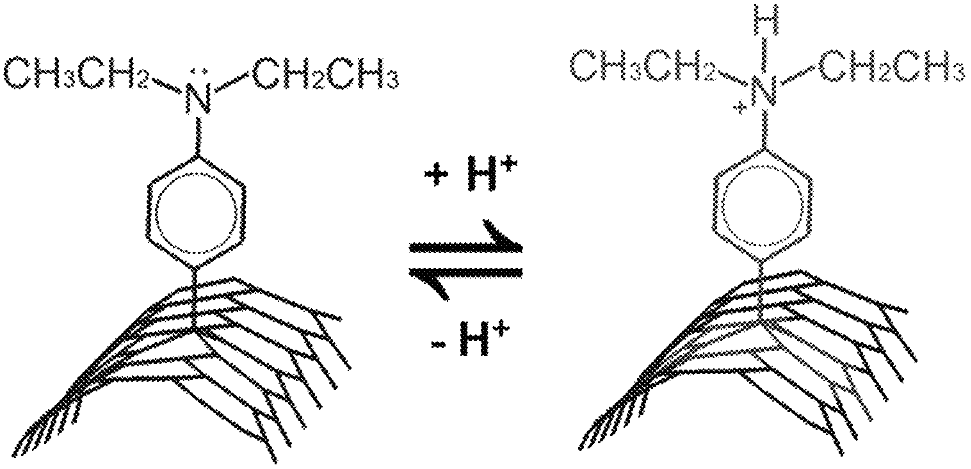
FIG. 9 illustrates a sensor chemistry example that is implemented in an optoelectronic chemical sensor of the invention and particularly in a sensor as illustrated in FIG. 8. An exemplary aminoaryl organic color center is shown covalently bonded on the sidewall of a semiconducting carbon nanotube. Emission from the illustrated color center is strongly dependent upon pH ($H^+$ concentration).

Specific examples of organic color centers useful in implementation of sensors herein are provided. It has been shown that the defect PL in (6,5)-SWCNT-$C_6H_4N(CH_2CH_3)_2$ is sensitively dependent on solution pH and temperature (Kwon et al. 2015). Both the emission intensity and wavelength are strongly modulated by the pH, with a large, 18 meV redshift as the NN-diethyl-4-aminoaryl defect is protonated (at the N atom). The chemical structure of this color center or defect is illustrated in FIG. 9. The defect PL closely traces the titration curve of the aminobenzene group.

The N,N-diethyl-4-aminobenzene moiety is covalently attached to the nanotube sidewall via diazonium chemistry to create discrete pH and temperature-sensitive defect centers. The defect PL is resolvable to changes of 0.2 pH units within pH 5.5 to 8.0 and 0.3 pH units across a working window spanning 4 pH units (pH 4.0 to 8.0). Control experiments with a series of para-substituted aryl functional groups confirm that only amine moieties show pronounced pH dependence. Other terminating moieties such as methoxy, bromo, and nitro, do not show pH-responsive emission. The pH dependence originates exclusively from the covalently attached aminoaryl functional groups. This same color center may be used to detect metal ions, such as $Cu^{2+}$, $Zn^{2+}$, $Hg^{2+}$, and $Co^{2+}$. In general, color centers carrying —$NH_2$ or —COOH terminated functional groups may be used for detection of such metal ions. Further, —$NH_2$ or —COOH groups in color centers can provide linkers for further covalent attachment of other functional groups. For example, one or more metal chelating agents, such as ethylenediaminetetraacetic acid (EDTA) can be bonded into color centers using synthetic methods that are well-known in the art to function for chelation to metals and metal detection.

Figure 10:
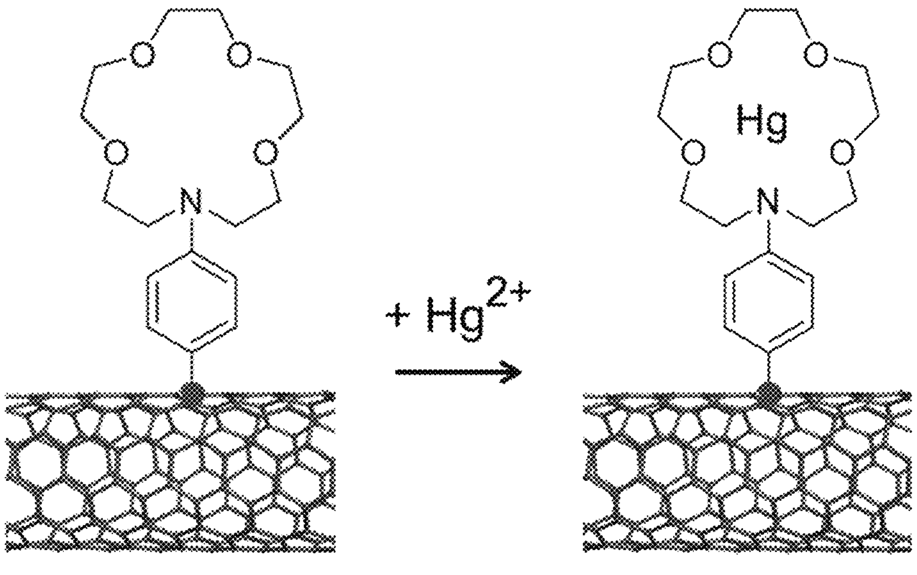
FIG. 10 illustrates another sensor chemistry example that is implemented in an optoelectronic chemical sensor of the invention and particularly in a sensor as illustrated in FIG. 8. The figure illustrates covalent attachment of an exemplary crown ether moiety to the side wall of a semiconducting carbon nanotube. The crow ether moiety, as is known in the art, can complex at least with various cations. Complexation with a cation can affect emission from the illustrated color center. In particular, such a crown ether moiety can complex mercury cations (e.g., $Hg^{2+}$). Implementation of a sensor with the illustrated color center will provide a sensor for detection of certain cations and particularly as illustrated as a sensor for mercury cations. The size of the crown ether, again as is known in the art, can be varied to vary the complexation of the crown ether with various chemical species to implement sensors for different chemical species that complex with the crown ether.

Another example of a color center useful for sensors herein is illustrated in FIG. 10. This organic color center features covalent attachment of a crown ether, specifically N-phenylaza-15-crown-5-ether. The crown either moiety is covalently bonded to a carbon nanotube sidewall through an aryl group (specifically a phenyl group). This bonding can be achieved for example using arylation reactions using halogenated aryl groups covalently bonded to a selected crown ether. Crown ethers are known in the art to complex with various chemical species and in particular to complex with certain cations. Selectivity of such complexation has been observed. The crown ether moiety is illustrates in FIG. 10 as complexed with $Hg^{2+}$ to induce a change in the emission from the color center. This implementation of a sensor with the illustrated color center provides a sensor for detection of certain cations and particularly as illustrated as a sensor for mercury cations. The size of the crown ether, again as is known in the art, can be varied to vary the selectivity of complexation of the crown ether with various chemical species to implement sensors for different chemical species that complex with the crown ether.

Figure 11:
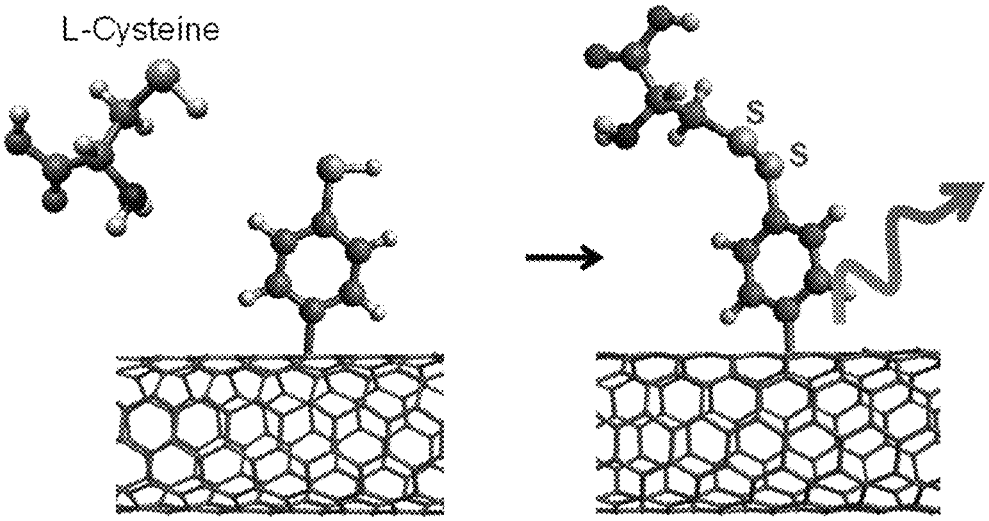
FIG. 11 illustrates another sensor chemistry example that is implemented in an optoelectronic chemical sensor of the invention and particularly in a sensor as illustrated in FIG. 8. The figure illustrates covalent attachment of an exemplary aryl thiol group to the side wall of a semiconducting carbon nanotube. The aryl thiol group, as known in the art, can undergo reaction with molecules containing thiols to form disulfide bonds. Reaction to form a disulfide bond affect emission from the illustrated color center. Conversely, a moiety carrying a disulfide bond can be covalently attached to the side wall of a semiconducting carbon nanotube and the disulfide bond can be cleaved affecting emission form the color center. This type of organic color center can be used to detect the formation or cleavage of a dithiol bond which is a redox reaction. This type of organic color center is an example that can be used to detect a redox reaction.

Yet another example of a color center useful for sensors herein is illustrated in FIG. 11. Balancing the oxidative state is essential for living cells to function properly. Although not entirely understood, oxidative stress is believed to contribute to the development of a wide range of diseases including Alzheimer's disease, Parkinson's disease and the pathologies caused by diabetes. Oxidative damage to the DNA also cause cancer. Therefore, a sensing method useful to probe the redox state and redox reactions in biological systems, including, for example, a living cell will be useful for detecting those diseases at their early stages. To balance the oxidative state, plants and animals develop complex systems of overlapping antioxidants. Thioredoxin is a small redox protein containing a dithiol-disulfide active site. Thioredoxin is found in many organisms from plants and bacteria to mammals, and acts as antioxidants by facilitating the reduction of other proteins by thiol-disulfide exchange.

Analogous to the thioredoxin, organic color centers can be prepared that contain the dithiol-disulfide redox active site to probe local redox reactions. This is achieve, for example, as illustrated by covalently attaching aryl thiol groups to the nanotube sidewall and then using the introduced thiol group to form disulfide with other thiol containing molecules such as the amino acid cysteine. Other thiol containing species include among others, proteins, peptides, residues of proteins, and oligopeptides containing thiols. The illustrated disulfide chemistry occurs in a way similar to the dithiol-disulfide active site in Thioredoxin allowing other molecules or proteins to be reduced. This redox event is then transduced to the photon emitted from the organic color center. The illustrated example of L-Cysteine simplifies the system by avoiding strict physiologic conditions, but still resemble the chemistry between the thiol and protein or other peptides. The thiol group undergoes the reductive reaction via the formation of a disulfide bond. The interconversion between thiols and disulfide groups is a redox reaction: the thiol is the reduced state, and the disulfide is the oxidized state. The formation or breakage of the disulfide bond modifies the potential well of the organic color center, making it possible to detect the redox reaction.

The exemplified color centers hosted in semiconducting color center host, such as semiconducting carbon nanotubes, can be employed in sensors of the invention and in particular can be implemented in sensor devices of the invention as illustrated in FIG. 8 herein.

Sensor herein can be implemented in a device configuration as described for the single-photon sources herein. Alternatively, the sensor device configuration need not produce single photons. A plurality of color center hosts of sensors herein can be formed into a film and sensor device configurations analogous to that illustrated in FIG. 8 can be adapted to such thin films of color center hosts. In an embodiment, a sensor comprises one or more color center hosts, e.g., carbon nanotubes or graphene nanoribbons. In an embodiment, a sensor comprises a plurality of color center hosts. In an embodiment, each color center host of such plurality can comprise the same color center which are sensitive to the same analyte or physical change. In an embodiment, among the plurality of color center hosts in the center there can be a portion of the color center hosts that have different color centers that are sensitive to different analytes or different physical changes. In an embodiment, the plurality of color center hosts can be formed into a thin film. In an embodiment, the thin film ranges in thickness from submonlayer to 10 nm. In an embodiment, the thin film ranges in thickness from submonolayer to 1 nm. In an embodiment, the color centers of the plurality of color center hosts are patterned with defined locations in the film, where different locations can be associated with color center hosts having the same or different color centers. For example, a film may be patterned with a plurality of color center hosts, wherein a first portion of the plurality of color center hosts with a first color center is positioned at first defined locations and wherein a second portion of the plurality of color center hosts with a second color center is positioned at second defined locations. Such patterning can be extended to a selected number (n) of different color centers at different defined locations. The selected number (n) for such patterning can, for example, be 2-100, 2-50, 2-25, 2-10 or subranges thereof.

U.S. Pat. No. 8,373,157 includes a description of the preparation and use of thin films of carbon nanotubes in light emitting device. The methods and device structures described therein can be used or readily adapted in view of the disclosure herein to prepare sensor device of this invention containing thin films of carbon nanostructures, particularly carbon nanotubes. This patent is incorporated by reference herein in its entirety for description of such methods and device structures.

Sensors herein can be applied for the detection of selected chemical species (analytes), the measurement of pH, the measurement of redox potential and the measurement of local environmental characteristics such as temperature. Such measurements can be applied or adapted to any environment in which such measurements are desired to be made. In a specific embodiment, the sensors of the invention, and particularly those that employ carbon nanostructures can be employed for measurements of small volumes, such as in biological cells and particularly in living cells.

All patents and publications mentioned in the specification are indicative of the levels of skill of those skilled in the art to which the invention pertains. All references cited herein are hereby incorporated by reference to the extent not inconsistent with the disclosure herewith. All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of alternatives, such as a group of substituents or device elements is disclosed herein, it is understood that all individual members of those groups and all subgroups are disclosed separately. When a compound is claimed, it should be understood that compounds known in the art including the compounds disclosed in the references disclosed herein are not intended to be included. When a Markush group or other grouping is used herein, all individual members of the group and all combinations and subcombinations possible of the group are intended to be individually included in the disclosure.

One of ordinary skill in the art will appreciate that methods, device elements, starting materials and synthetic methods other than those specifically exemplified can be employed in the practice of the invention without resort to undue experimentation. All art-known functional equivalents, of any such methods, device elements, starting materials and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claimed invention. Herein, the basic and novel characteristics of the claimed invention, in one aspect include, electrically driven single photon emission based on emission associated with color centers in color center hosts, particularly in color center hosts that are carbon nanomaterials, including carbon nanotubes and graphene nanoribbons. In particular, materials or steps that interfere with the single photon generation are excluded. In another aspect, the basic and novel characteristics are optical sensors which employ the emission from one or more color center hosts, particularly color center hosts that are carbon nanomaterials, including carbon nanotubes and graphene nanoribbons for sensing applications. In particular, materials or steps that interfere with the interaction between the color center and an analyte or disrupt or alter emission so that sensing is disrupted are excluded.

Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art. The preceding definitions are provided to clarify their specific use in the context of the invention Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

REFERENCES CITED

Aharonovich, I., D. Englund, et al. (2016). "Solid-State Single-Photon Emitters." Nat. Photonics 10(10): 631-641.

Aharonovich, I. and E. Neu (2014). "Diamond Nanophotonics." Adv. Opt. Mater. 2(10): 911-928.

Avouris, P., M. Freitag, et al. (2008). "Carbon-nanotube photonics and optoelectronics." Nat. Photonics 2(6): 341-350.

O. Benson, Carles Santori, M. Pelton & Y. Yamamoto (2000) "Regulated and Entangled Photons from a Single Quantum Dot" Physical Review Letters, volume 84, pp. 2513-2515 (2000).

Bose, R., T. Cai, et al. (2012). "All-optical tuning of a quantum dot in a coupled cavity system." Appl. Phys. Lett. 100(23): 231107/231101-231107/231104.

Boto, A. N., P. Kok, et al. (2000). "Quantum Interferometric Optical Lithography: Exploiting Entanglement to Beat the Diffraction Limit." Phys. Rev. Lett. 85(13): 2733-2736.

Brozena, A. H., J. D. Leeds, et al. (2014). "Controlled Defects in Semiconducting Carbon Nanotubes Promote Efficient Generation and Luminescence of Trions." ACS Nano 8(5): 4239-4247.

Cao, Q. and S.-j. Han (2013). "Single-walled carbon nanotubes for high-performance electronics." Nanoscale 5(19): 8852-8863.

Chen, J., V. Perebeinos, et al. (2005). "Bright Infrared Emission from Electrically Induced Excitons in Carbon Nanotubes." Science (Washington, DC, U. S.) 310(5751): 1171-1174.

Deng, S., Y. Zhang, et al. (2011). "Confined propagation of covalent chemical reactions on single-walled carbon nanotubes." Nature Communications 2: 382.

Galland, C. and A. Imamoglu (2008). "All-optical manipulation of electron spins in carbon-nanotube quantum dots." Phys. Rev. Lett. 101(15): 157404.

Gisin, N. and R. Thew (2007). "Quantum communication." Nat. Photonics 1(3): 165-171.

Gordon, L., J. R. Weber, et al. (2013). "Quantum computing with defects." MRS Bull. 38(10): 802-807.

He, X., N. F. Hartmann, et al. (2017). "Tunable Room-Temperature Single-Photon Emission at Telecom Wavelengths from sp3 Defects in Carbon Nanotubes." Nat. Photonics 11: 577.

Heller, D. A.; Jeng, E. S.; Yeung, T.-K.; Martinez, B. M.; Moll, A. E.; Gastala, J. B.; Strano, M. S. Optical detection of DNA conformational polymorphism on single-walled carbon nanotubes.

Science 2006, 311, 508-511.

Hong, G.; Diao, S.; Antaris, A. L.; Dai, H. Carbon nanomaterials for biological imaging and nanomedicinal therapy. Chem. Rev. 2015, 115, 10816-10906.

Huang, J.; Ng, A. L.; Piao, Y.; Chen, C. F.; Green, A. A.; Sun, C. F.; Hersam, M. C.; Lee, C. S.; Wang, Y. Covalently functionalized double-walled carbon nanotubes combine high sensitivity and selectivity in the electrical detection of small molecules. J. Am. Chem. Soc. 2013, 135, 2306-2312.

Khasminskaya, S. et al. (2016) "Fully integrated quantum photonic circuit with an electrically driven light source." Nat. Photon. 10, 727-732.

Keithyl Instruments, Inc. (Cleveland, OH) 4200-SCS Semiconductor Characterization System Technical Data available from the web site keithley.com, see particularly current specification and voltage specifications on page 6.

Kim, J.-H., C. J. K. Richardson, et al. (2016). "Two-Photon Interference from the Far-Field Emission of Chip-Integrated Cavity-Coupled Emitters." Nano Lett. 16(11): 7061-7066.

Knill, E., R. Laflamme, et al. (2001). "A scheme for efficient quantum computation with linear optics." Nature (London) 409(6816): 46-52.

Kwon, H.; Kim, M.; Meany, B.; Piao, Y.; Powell, L. R.; Wang, Y. Optical probing of local pH and temperature in complex fluids with covalently functionalized, semiconducting carbon nanotubes. J. Phys. Chem. C 2015, 119, 3733-3739.

Kwon, H., A. O. Furmanchuk, et al. (2016). "Molecularly Tunable Fluorescent Quantum Defects." J. Am. Chem. Soc. 138(21): 6878-6885.

Kwon, H. J., M. Kim, et al. (2018). "Ultra-bright Trions Observed at Fluorescent Quantum Defects." Nature Commun. under review.

Lamas-Linares, A., J. C. Howell & D. Boumeester (2001) "Stimulated emission of polarization-entangle photons" Nature 412, 887-890.

Lee, J. U., P. P. Gipp, et al. (2004). "Carbon nanotube p-n junction diodes." Appl. Phys. Lett. 85(1): 145-147.

Lounis, B. and M. Orrit (2005). "Single-photon sources." Rep. Prog. Phys. 68(5): 1129-1179.

Maldonado-Trapp, A., P. Solano, et al. (2016). "Realizing quantum advantage without entanglement in single-photon states." arXiv.org, e-Print Arch., Quantum Phys.: 1-9.

Mueller, T., M. Kinoshita, et al. (2010). "Efficient narrow-band light emission from a single carbon nanotube p-n diode." Nat. Nanotechnol. 5(1): 27-31.

O'Brien, J. L. (2007). "Optical Quantum Computing." Science (Washington, DC, U. S.) 318(5856): 1567-1570.

O'Brien, J. L., A. Furusawa, et al. (2009). "Photonic quantum technologies." Nat. Photonics 3(12): 687-695.

Piao, Y., B. Meany, et al. (2013). "Brightening of carbon nanotube photoluminescence through the incorporation of sp3 defects." Nat Chem 5(10): 840-845.

Powell, L. R., M. Kim, et al. (2017). "Chirality-Selective Functionalization of Semiconducting Carbon Nanotubes with a Reactivity-Switchable Molecule." Journal of the American Chemical Society 139(36): 12533-12540.

Powell, L. R., Y. Piao, et al. (2016). "Optical Excitation of Carbon Nanotubes Drives Localized Diazonium Reactions." The Journal of Physical Chemistry Letters 7(18): 3690-3694.

Pyatkov, F. et al. (2016) "Cavity-enhanced light emission from electrically driven carbon nanotubes." Nat. Photon. 10, 420-427.

Srinivasan, K. and M. Zheng (2017). "Quantum optics: Nanotube chemistry tunes light." Nat Photon 11(9): 535-537.

Srivastava, A., M. Sidler, et al. (2015). "Optically active quantum dots in monolayer WSe2." Nat. Nanotechnol. 10(6): 491-496.

Tran, T. T., K. Bray, et al. (2016). "Quantum emission from hexagonal boron nitride monolayers." Nat. Nanotechnol. 11(1): 37-41.

Tu, X., S. Manohar, et al. (2009). "DNA sequence motifs for structure-specific recognition and separation of carbon nanotubes." Nature 460(7252): 250-253.

Tulevski, G. S., A. D. Franklin, et al. (2014). "Toward high-performance digital logic technology with carbon nanotubes." ACS Nano 8(9): 8730-8745.

Wolf, S. A., D. D. Awschalom, et al. (2001). "Spintronics: A spin-based electronics vision for the future." Science 294(5546): 1488.

Wu, X., M. Kim, et al. (2018). "Photochemical Creation of Fluorescent Quantum Defects in Semiconducting Carbon Nanotube Hosts." Angewandte Chemie International Edition 57(3): 648-653.

Zhang, Y., N. Valley, et al. (2013). "Propagative sidewall alkylcarboxylation that induces red-shifted near-IR photoluminescence in single-walled carbon nanotubes." J. Phys. Chem. Lett. 4(5): 826-830.

The invention claimed is:

1. A single-photon source comprising:

a. a semiconducting color center host which is a semiconducting carbon nanotube or graphene nanoribbon that includes an organic color center chemically introduced by covalently bonding an organic moiety into the $sp^2$ carbon lattice of the color center host through formation of a C—C bond;

b. a source and drain electrode in electrical contact with the semiconducting color center host to separately inject electrons and holes into the semiconducting color center host and the organic color center; and c. at least two gate electrodes, not electrically connected to the semiconducting color center host or the organic color center, positioned on opposite sides of the organic color center along the length of the semiconducting color center host;

d. a stabilized voltage source for the source and drain electrodes and each gate electrode; and e. a current limiting circuit configured to regulate the current of electrons and holes across the organic color center to less than 1 nanoampere;

wherein electrons and holes are separately injected into the organic color center to generate single photons.

2. The source of claim 1, wherein the organic moiety is a divalent organic moiety.

3. The source of claim 2, wherein the divalent organic moiety is selected from $>CH_2$, $>C_6H_4$, or a fluorinated derivative thereof.

4. The source of claim 1, wherein the semiconducting color center host is a semiconducting carbon nanotube selected from a single-walled carbon nanotube, or a double-walled carbon nanotube.

5. The source of claim 1, wherein the semiconducting color center host is a semiconducting single-walled carbon nanotube selected from those of structures: (10,0), (11,0), (13,0), (14,0), (16,0), (17,0), (11,1), (12,1), (14,1), (15,1), (8,7), (9,7), and (9,8).

6. The source of claim 2, wherein the semiconducting color center host is a semiconducting single-walled carbon nanotube selected from those of structures: (10,0), (11,0), (13,0), (14,0), (16,0), (17,0), (11,1), (12,1), (14,1), (15,1), (8,7), (9,7), and (9,8) and the organic moiety is a divalent organic moiety selected from $>CH_2$, $>CF_2$, $>C_6H_4$, $>C_6F_4$, or $>C_6H_2F_2$.

7. The source of claim 1, wherein the at least two gate electrodes represent a split gate configuration wherein the gate electrodes produce a p-electrostatically doped region on one side of the organic color center and an n-electrostatically doped region on the other side of the organic color center in the semiconducting color center host.

8. The source of claim 7, further comprising a third gate electrode that is insulated from the organic color center and, wherein a potential of the third gate electrode is directly applied to the organic color center to tune its energy level with respect to the source and drain.

9. The source of claim 1, wherein the voltage source is configured to apply a voltage through the source and drain electrodes is-no more than 0.50 eV higher than the photon energy of the single photons that emit by electron/hole recombination at the organic color center.

10. The source of claim 9, wherein the voltage applied through the source and drain electrodes is equal to or at most 30 meV less than the photon energy of the single photons that emit by electron/hole recombination at the organic color center.

11. The source of claim 1, wherein the current limiting circuit regulates the current of electrons and holes across the color center to between $1\times10^{-17}$ amp and $1\times10^{-9}$ amp.

12. The source of claim 1, wherein the ratio of electrons to holes injected into the organic color center is 1+/−0.05%.

13. The source of claim 1, wherein the ratio of electrons to holes injected into the organic color center ranges from 0.5 to 1.5.

14. The source of claim 1, wherein the single photon emitted by the source has a wavelength ranging from 880 nm-2500 nm.

15. An optoelectronic chemical sensor which comprises a. a single photon source of claim 1, wherein photon emission of the organic color center changes in energy, intensity or both when the organic color center (1) interacts with a specific chemical species to be detected and/or (2) responds to temperature change in the local environment; and b. a detector to detect a change in photon emission from the organic color center upon interaction (1) or response (2).

16. The optoelectronic chemical sensor of claim 15, wherein the semiconducting color center host is one or more semiconducting carbon nanotubes each having the organic color center.

17. The optoelectronic chemical sensor of claim 16, wherein the one or more semiconducting carbon nanotubes are a plurality of semiconducting carbon nanotubes, each having the organic color center, formed into a thin film.

18. The optoelectronic chemical sensor of claim 15, wherein the organic color center of the semiconducting color center host contains one or more of the following chemical moieties: —COOH, —$NH_2$, or an oligonucleotide.

19. The source of claim 2, wherein the divalent organic moiety is selected from >$C(R)_2$, and >$C_6(R)_4$, where R is H, an optionally substituted alkyl group, an optionally substituted aryl group or a fluorinated alkyl or aryl group, where optional substitution, includes substitution with an amino (—$NH_2$) or a carboxylic acid group (—COOH).

20. The source of claim 1, wherein the current limiting circuit regulates the current of electrons and holes across the color center to between $1\times10^{-12}$ amp and $1\times10^{-10}$ amp.

21. A single-photon source consisting essentially of:

a. a semiconducting color center host which is a semiconducting carbon nanotube or graphene nanoribbon that includes an organic color center chemically introduced by covalently bonding an organic moiety into the $sp^2$ carbon lattice of the color center host through formation of a C—C bond;

b. a source and drain electrode in electrical contact with the semiconducting color center host to separately inject electrons and holes into the semiconducting color center host and the organic color center; and c. at least two gate electrodes, not electrically connected to the semiconducting color center host or the organic color center, positioned on opposite sides of the organic color center along the length of the semiconducting color center host;

d. a stabilized voltage source for the source and drain electrodes and each gate electrode; and e. a current limiting circuit configured to regulate the current of electrons and holes across the organic color center to less than 1 nanoampere;

wherein electrons and holes are separately injected into the organic color center to generate single photons.

* * * * *